United States Patent
Li et al.

(10) Patent No.: US 11,527,659 B2
(45) Date of Patent: Dec. 13, 2022

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Ming-Yang Li, Hsinchu (TW); Lain-Jong Li, Hsinchu (TW); Han Yeh, Hsinchu County (TW); Wen-Hao Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 134 days.

(21) Appl. No.: 17/069,875

(22) Filed: Oct. 14, 2020

(65) Prior Publication Data
US 2022/0115541 A1   Apr. 14, 2022

(51) Int. Cl.
*H01L 21/302* (2006.01)
*H01L 21/04* (2006.01)
(Continued)

(52) U.S. Cl.
CPC ...... *H01L 29/78696* (2013.01); *H01L 23/142* (2013.01); *H01L 23/544* (2013.01); *H01L 29/517* (2013.01)

(58) Field of Classification Search
CPC ........... H01L 21/16–608; H01L 27/124; H01L 27/1225
See application file for complete search history.

(56) References Cited

U.S. PATENT DOCUMENTS

| 9,147,824 B1* | 9/2015 | Cao ..................... H01L 29/401 |
| 2014/0206192 A1* | 7/2014 | Yeom ................... H01L 21/042 |
| | | 438/720 |

(Continued)

OTHER PUBLICATIONS

Adrien Allain, et al., "Electrical contacts to two-dimensional semiconductors." Nature Materials, vol. 14, Dec. 2015, pp. 1195-1205.

(Continued)

*Primary Examiner* — Brian Turner
(74) *Attorney, Agent, or Firm* — JCIPRNET

(57) ABSTRACT

A semiconductor device includes channel region, first and second two-dimensional metallic contacts, a gate structure, and first and second metal contacts. The channel region includes a two-dimensional semiconductor material. The first two-dimensional metallic contact is disposed at a side of the channel region and includes a two-dimensional metallic material. The second two-dimensional metallic contact is disposed at an opposite side of the channel region and includes the two-dimensional metallic material. The gate structure is disposed on the channel region in between the first and second two-dimensional metallic contacts. The first metal contact is disposed at an opposite side of the first two-dimensional metallic contact with respect to the channel region. The second metal contact is disposed at an opposite side of the second two-dimensional metallic contact with respect to the channel region. The first and second two-dimensional metallic contacts contact sideways the channel region to form lateral semiconductor-metallic junctions.

20 Claims, 42 Drawing Sheets

(51) Int. Cl.
*H01L 29/66* (2006.01)
*H01L 29/16* (2006.01)
*H01L 29/786* (2006.01)
*H01L 23/14* (2006.01)
*H01L 23/544* (2006.01)
*H01L 29/51* (2006.01)

(56) References Cited

U.S. PATENT DOCUMENTS

| | | | |
|---|---|---|---|
| 2016/0056301 A1* | 2/2016 | Lee | H01L 29/42352 |
| | | | 257/295 |
| 2017/0012117 A1* | 1/2017 | Radosavljevic | H01L 29/786 |
| 2017/0345944 A1* | 11/2017 | Lin | H01L 29/41766 |
| 2018/0269059 A1* | 9/2018 | Lin | H01L 29/78681 |
| 2021/0066069 A1* | 3/2021 | Lee | H01L 21/02491 |

OTHER PUBLICATIONS

Xuechao Yu, et al., "Atomically thin noble metal dichalcogenide: a broadband mid-infrared semiconductor." Nature Communications, vol. 9, Apr. 2018, pp. 1-9.
Alberto Ciarrocchi, et al., "Thickness-modulated metal-to-semiconductor transformation in a transition metal dichalcogenide." Nature Communications, vol. 9, Mar. 2018, pp. 1-6.

* cited by examiner

SEMICONDUCTOR DEVICE AND MANUFACTURING METHOD THEREOF

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
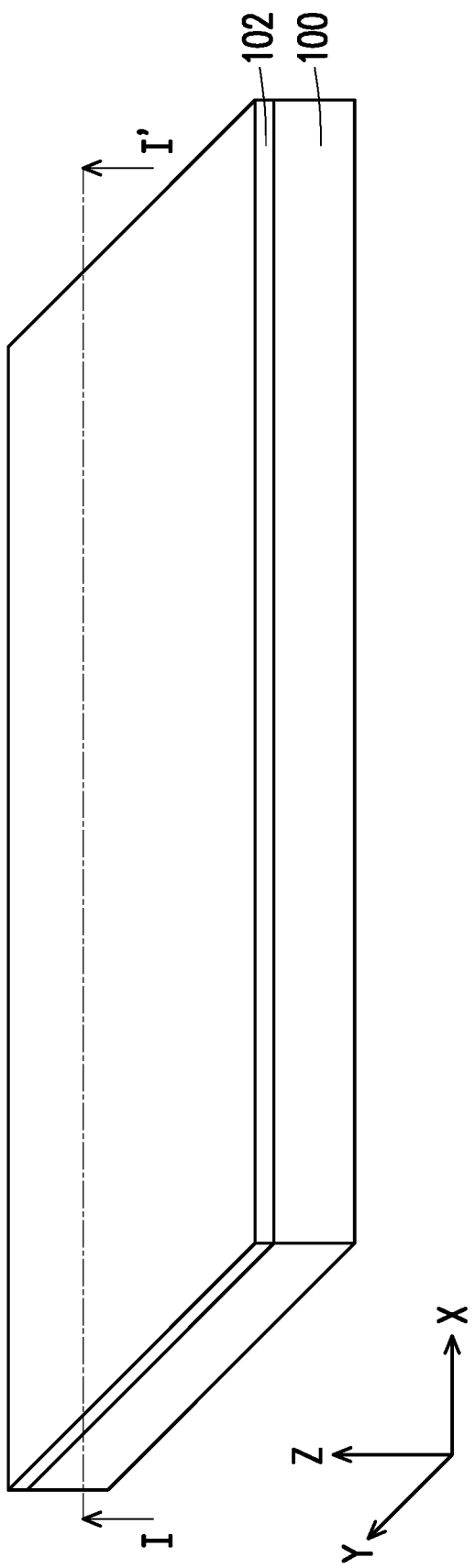
FIG. 1A to FIG. 1K are schematic perspective views of structures formed during a manufacturing process of a semiconductor device according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1K are schematic perspective views illustrating structures produced during a manufacturing process of a semiconductor device D10 according to some embodiments of the disclosure. FIG. 2A to FIG. 2K are schematic cross-sectional views of the structures respectively illustrated in FIG. 1A to FIG. 1K, taken in the XZ plane at the level height of the line I-I' along the Y direction. The directions X, Y, Z form a set of orthogonal Cartesian coordinates. Referring to FIG. 1A and FIG. 2A, a substrate 100 is provided. In some embodiments, the manufacturing process illustrated in FIG. 1A to FIG. 1K may be a front-end-of-line (FEOL) process, and the substrate 100 may be a semiconductor substrate, a semiconductor-on-insulator substrate, or the like. For example, the substrate 100 may include one or more semiconductor materials, which may be elemental semiconductor materials, compound semiconductor materials, or semiconductor alloys. For instance, the elemental semiconductor may include Si or Ge. The compound semiconductor materials and the semiconductor alloys may respectively include SiGe, SiC, SiGeC, a III-V semiconductor, a II-VI semiconductor, or semiconductor oxide materials. The semiconductor oxide materials may be one or more of ternary or higher (e.g., quaternary and so on) semiconductor oxides, such as indium gallium zinc oxide (IGZO), indium zinc oxide (IZO), or indium tin oxide (ITO).

In some embodiments, the substrate 100 may be a semiconductor-on-insulator, including at least one layer of dielectric material (e.g., an oxide layer) disposed between a pair of semiconductor layers (e.g., silicon layers). The substrate 100 may include doped regions depending on circuit requirements (e.g., p-type semiconductor substrate or n-type semiconductor substrate). In some embodiments, the doped regions may be doped with p-type or n-type dopants. In some alternative embodiments, the manufacturing process illustrated in FIG. 1A to FIG. 1K may be a back-end-of-line (BEOL) process, and the substrate 100 may be, for example, an interlayer dielectric layer formed on conductive patterns and other interlayer dielectric layers of an interconnection structure (not shown), where the interconnection structure is formed on a semiconductor substrate (not shown) including front-end-of-line devices. In such embodiments, the substrate 100 may include low-k dielectric materials, such as Xerogel, Aerogel, amorphous fluorinated carbon, parylene, bis-benzocyclobutenes (BCB), flare, hydrogen silsesquioxane (HSQ), fluorinated silicon oxide (SiOF), a combination thereof, or the like.

In some embodiments, a sheet 102 of two-dimensional semiconductor material is formed on the substrate 100. In some embodiments, the sheet 102 is a monolayer of the two-dimensional semiconductor material. In some embodiments, the sheet 102 includes one or more monolayers of the two-dimensional semiconductor material stacked on each other along the Z direction. The number of stacked monolayers is not particularly limited, as long as the two-dimensional semiconductor material retains semiconducting properties. In some embodiments, the two-dimensional semiconductor material may include a single type of atoms, or may include different types of atoms. For example, the two-dimensional semiconductor material may be graphene, phosphorene, transition metal chalcogenides (e.g., InSe), transition metal dichalcogenides (e.g., $MX_2$, where M is, for example, Mo, W, Zr, Hf, Sn, V, Pt, or Pd, and X is S, Se, or Te), or the like. Examples of transition metal dichalcogenides include $MoS_2$, $MoSe_2$, $MoTe_2$, $WS_2$, $WSe_2$, $WTe_2$, $ZrS_2$, $ZrSe_2$, $HfS_2$, $HfSe_2$, $SnS_2$, $SnSe_2$, $VSe_2$, $VTe_2$, $PtSe_2$, $PtTe_2$, and $PdSe_2$. In some embodiments, dopants or other defects may be implanted or produced to tune the semiconductor properties of the two-dimensional semiconductor material. In some embodiments, the two-dimensional semiconductor material may be fabricated or provided through any suitable process. For example, the two-dimensional semiconductor material may be grown by chemical vapor deposition (CVD), physical vapor deposition (PVD), atomic layer deposition (ALD) molecular beam epitaxy (MBE), chemical vapor transport (CVT) or the like. In some embodiments, the deposition temperature may be in the range from 300 to 800° C., and the deposition pressure may be in the range from 1 to 800 torr. In some embodiments, the two-dimensional semiconductor material may be obtained by exfoliation of bulk material, and one or more monolayers may be transferred on the substrate 100, for example via sacrificial tapes or supports including polymeric and/or metallic materials. In some alternative embodiments, the monolayer may be produced in situ, for example by reacting a transition metal film disposed on the substrate 100 with a chalcogen.

Figure 1B:
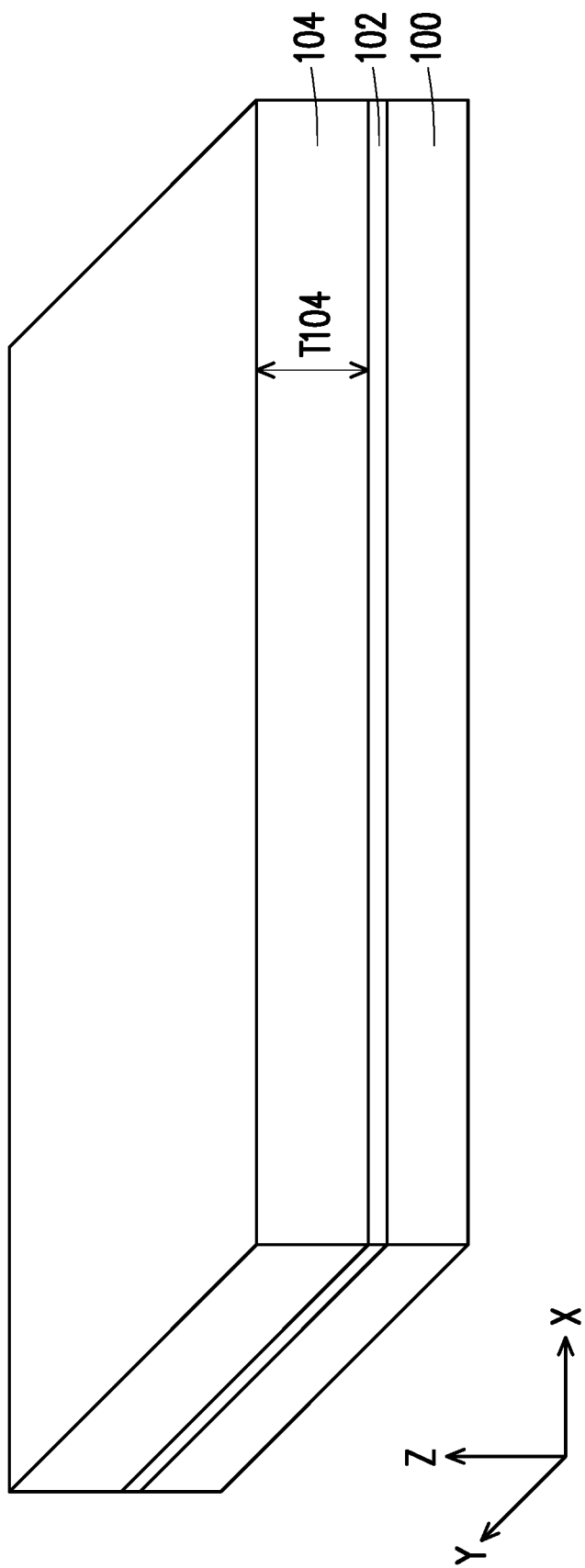
Figure 1C:
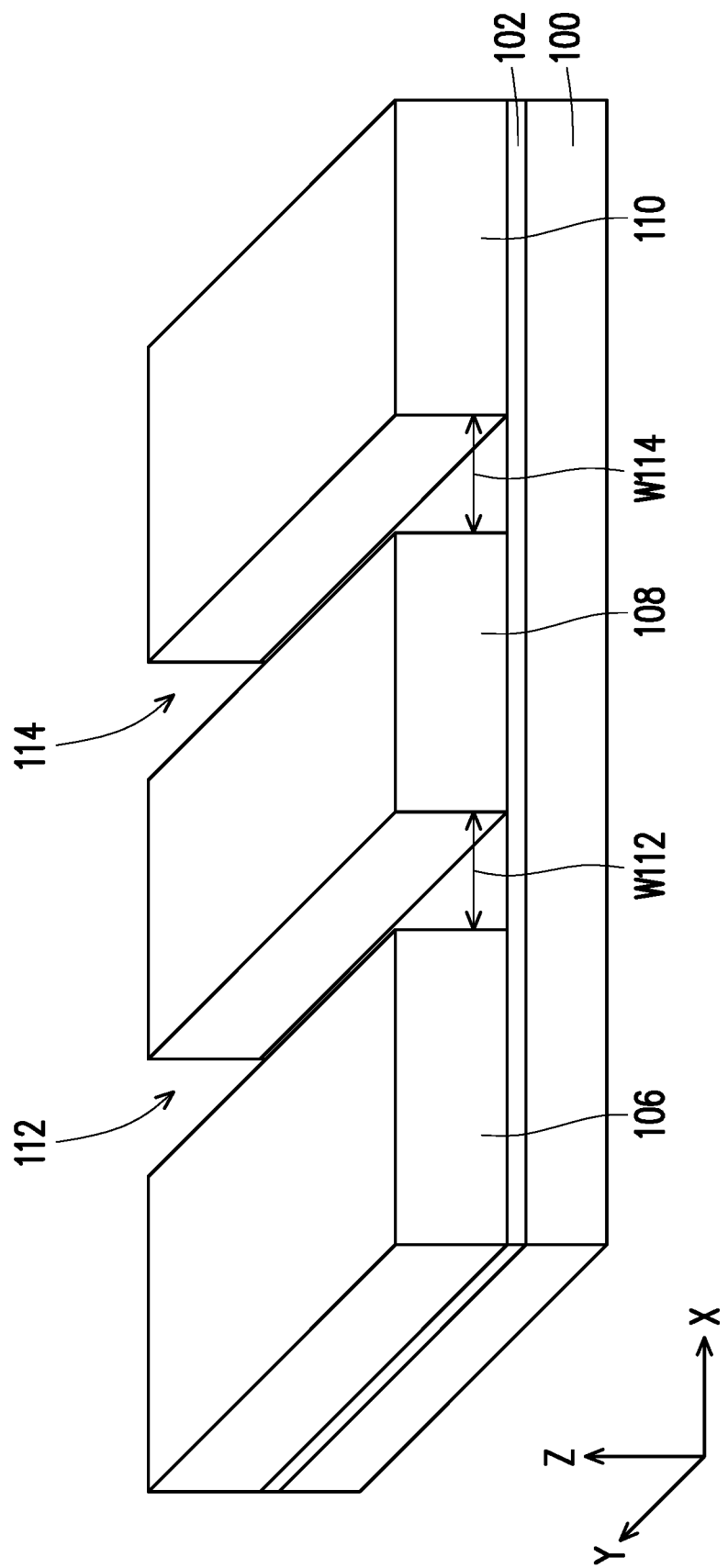
Figure 2A:
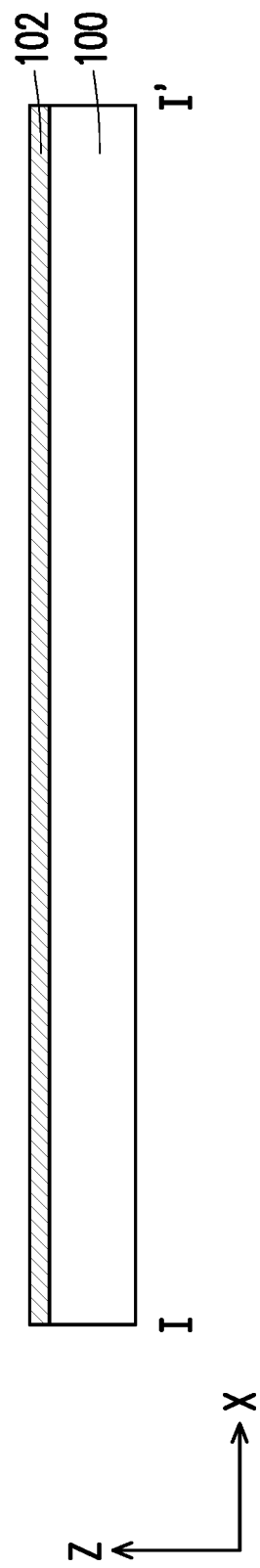
FIG. 2A to FIG. 2K are schematic cross-sectional views of the structures illustrated in FIG. 1A to FIG. 1K, respectively, according to some embodiments of the disclosure.
Figure 2B:
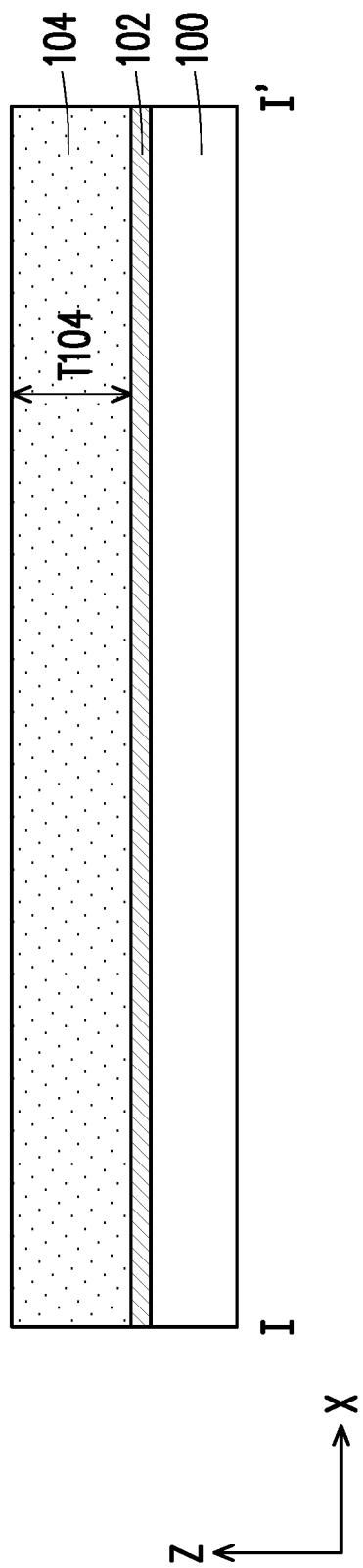
Figure 2C:
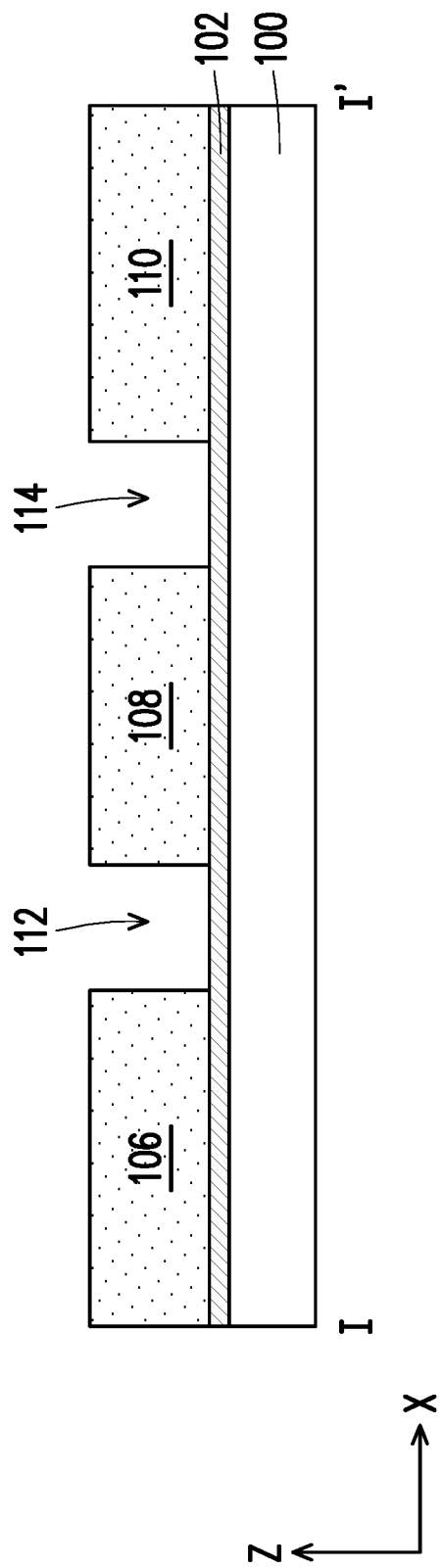

Referring to FIG. 1B and FIG. 2B, in some embodiments, a mask layer 104 is blanketly formed on the sheet 102. In some embodiments, the mask layer 104 includes an oxide, such as silicon oxide, aluminum oxide, or the like. In some alternative embodiments, the mask layer 104 includes a nitride, such as silicon nitride, silicon oxynitride, or the like.

In some embodiments, the thickness T104 of the mask layer 104 along the Z direction may be selected as a function of the desired thickness of the subsequently formed two-dimensional metallic contacts. In some embodiments, the thickness T104 may be in the range from 40 to 60 nm. In some embodiments, the mask layer 104 is formed through suitable deposition processes, such as plasma-enhanced CVD, PVD, ALD, or the like. In some embodiments, the mask layer 104 is patterned to form a plurality of mask strips 106, 108, 110, as illustrated, for example, in FIG. 1C and FIG. 2C. In some embodiments, patterning of the mask layer 104 may include a lithography process to form a patterned resist mask (not shown) on top of the mask layer 104. The pattern of the resist mask may then be transferred to the mask layer 104, for example via an etching step. In some embodiments, the etching step is a wet etching step, such as a buffered oxide etching step, in which an etchant such as hydrofluoric acid and a buffering agent, such as ammonium fluoride are employed, optionally in a mixture with other controlling agents. In some embodiments, the mask strips 106, 108, 110 run substantially parallel to each other, extending, for example, along the Y direction. Contact trenches 112, 114 extending along the Y direction may separate the mask strips 106, 108, 110 from each other along the X direction. For example, the mask strip 108 may be separated from the mask strip 106 by the contact trench 112 on one side, and from the mask strip 110 by the contact trench 114 at an opposite side along the X direction. In some embodiments, the contact trenches 112, 114 may independently have widths W112, W114 along the X direction in the range from 100 nm to 10 μm. In some embodiments, the widths W112, W114 need not be constant proceeding along the Y direction. For example, the contact trenches 112, 114 may present narrower regions and wider regions connected to the narrower regions.

Figure 1D:
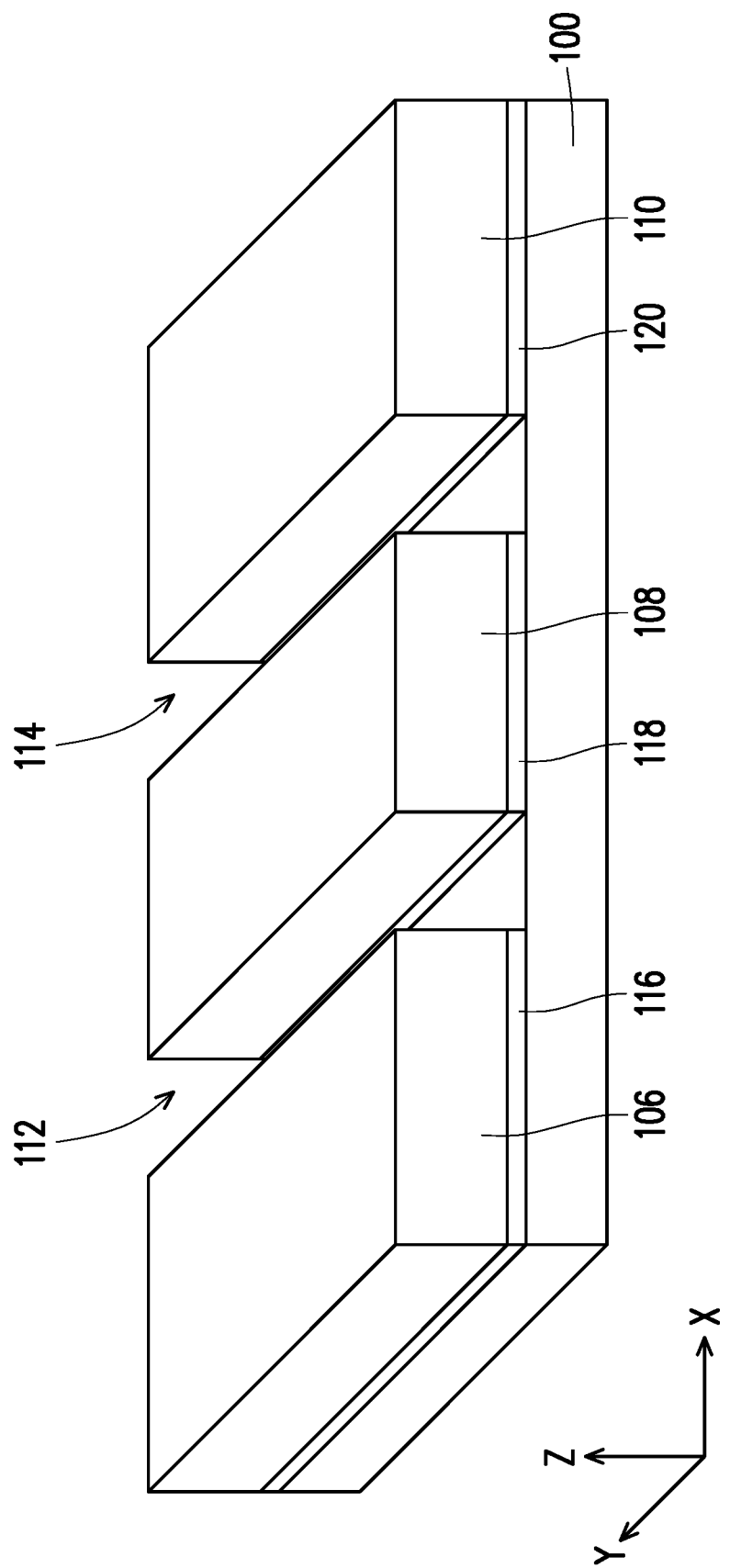
Figure 1E:
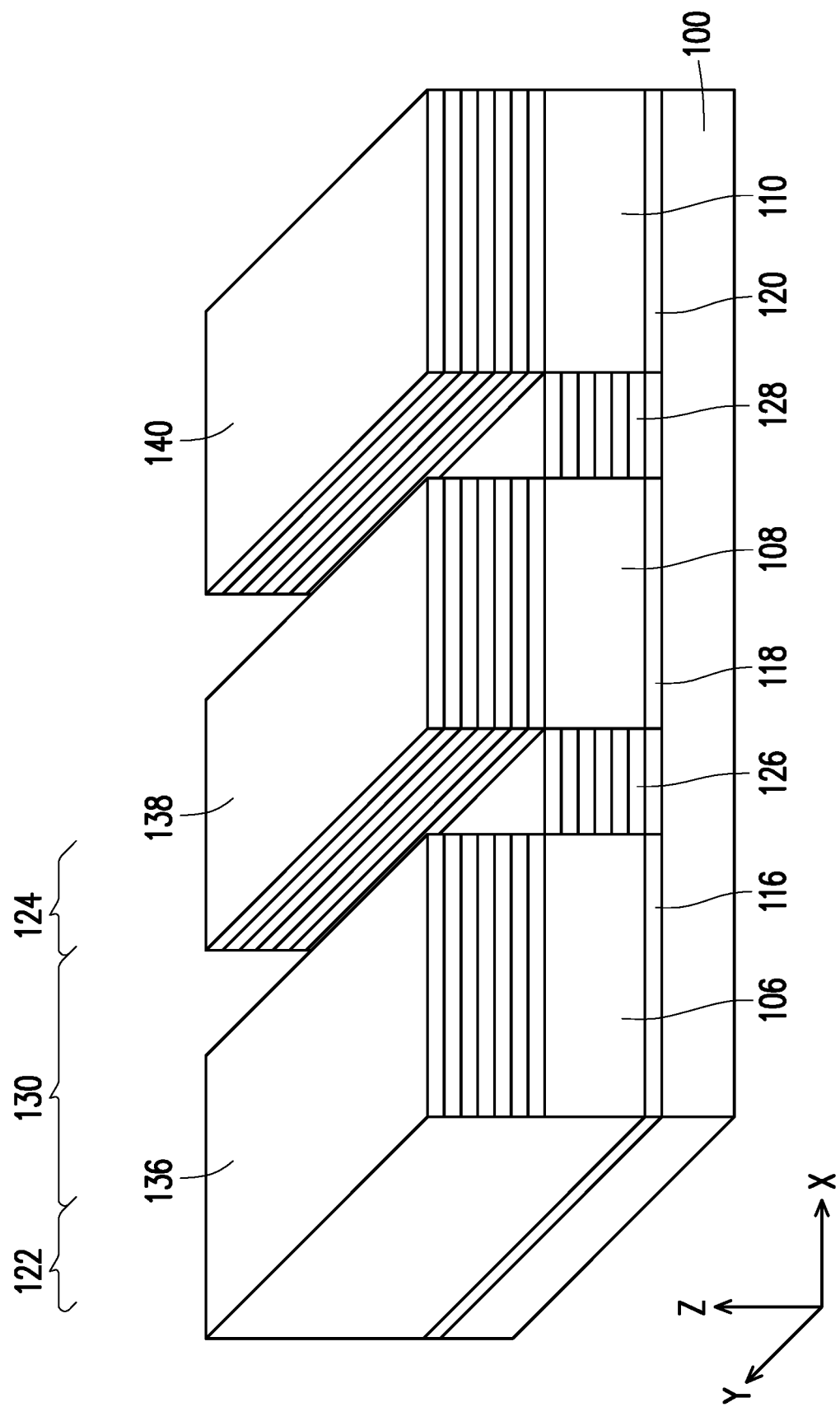
Figure 2D:
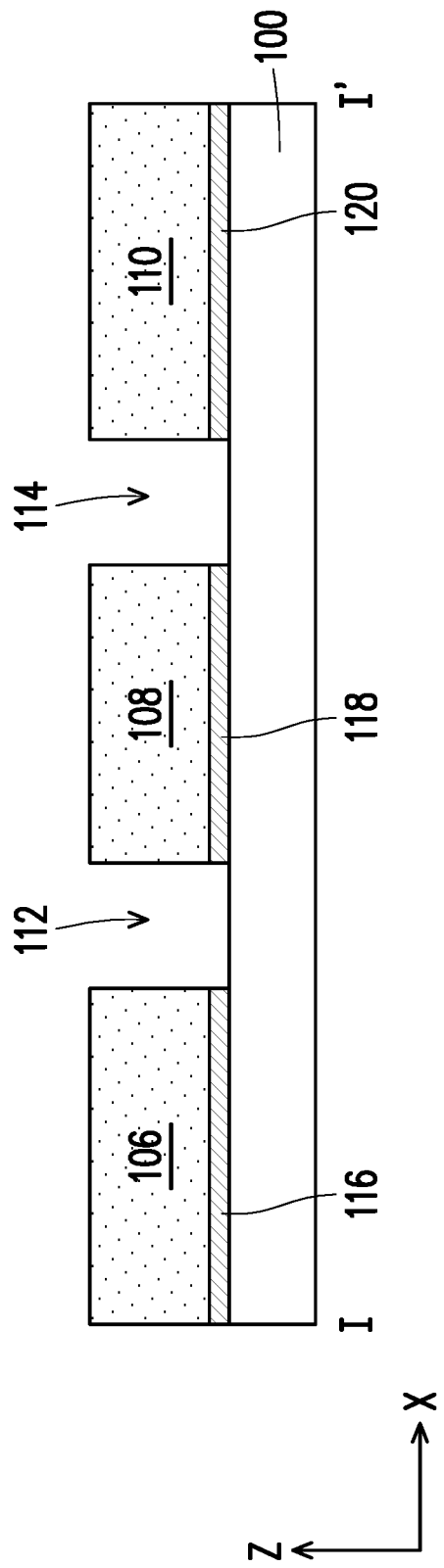
Figure 2E:
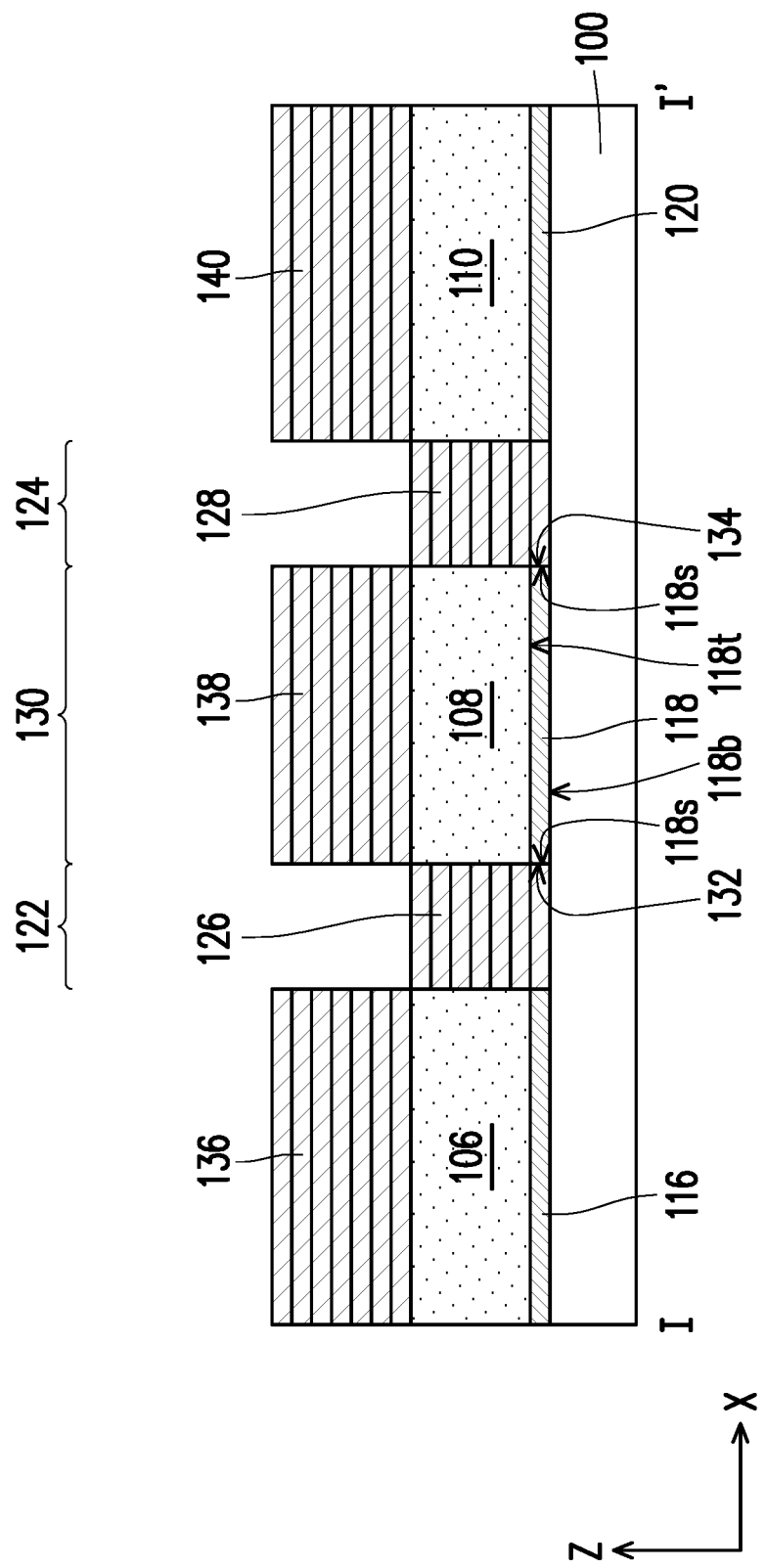

In some embodiments, portions of the sheet 102 are exposed at the bottom of the contact trenches 112, 114, while the remaining parts of the sheet 102 are buried under the mask strips 106, 108, 110. In some embodiments, the exposed portions of the sheet 102 may be removed, for example via an etching step employing plasma including oxygen or hexafluorosulfide. As illustrated in FIG. 1D and FIG. 2D, upon removal of the exposed portions of the sheet 102, the substrate 100 may be exposed at the bottom of the contact trenches 112, 114, and strips 116, 118, 120 of two-dimensional semiconductor material may remain below the mask strips 106, 108, 110, respectively. In some embodiments, the strips 116, 118, 120 are exposed along the sidewalls of the contact trenches 112, 114.

In some embodiments, referring to FIG. 1D, FIG. 1E, FIG. 2D and FIG. 2E, two-dimensional metallic contacts 122, 124 are formed within the contact tranches 112, 114. In some embodiments, the two-dimensional metallic contacts 122, 124 respectively include stacked monolayers (which may be collectively referred to as layers) 126, 128 of a two-dimensional metallic material formed within the contact trenches 112, 114. In some embodiments, the layers 126 of the two-dimensional metallic material are formed on the substrate 100 at the bottom of the contact trench 112. The bottommost monolayer of the layers 126 of the two-dimensional metallic material is disposed in between the strips 116 and 118 of two-dimensional semiconductor material, while the upper monolayers of the layers 126 may be disposed in between the mask strips 106 and 108. Similarly, the layers 128 of the two-dimensional metallic material are formed on the substrate 100 at the bottom of the contact trench 114. The bottommost monolayer of the layers 126 of the two-dimensional metallic material is disposed in between the strips 118 and 120 of the two-dimensional semiconductor material, while the upper monolayers of the layers 128 may be disposed in between the mask strips 108 and 110. In some embodiments, the two-dimensional metallic contacts 122, 124 are formed by growing the layers 126, 128 of two-dimensional metallic material into the contact trenches 112, 114. In some embodiments, portions 136, 138, 140 of two-dimensional metallic material may be respectively formed on the mask strips 106, 108, 110, while forming the layers 126, 128 of two-dimensional metallic material in the contact trenches 112, 114. In some embodiments, the two-dimensional metallic material includes a compound having a substantially two-dimensional structure and metallic or semimetallic character. In some embodiments, the two-dimensional metallic material may include transition metal dichalcogenides having metallic or semimetallic character, such as compounds of formula $MX_2$, where M may be V, Nb, Ta, Ti, Hf, Mo, W, Pd, or Pt, and X may be S, Se, or Te. Examples of transition metal dichalcogenides having metallic character include $VS_2$, $VSe_2$, $VTe_2$, $NbS_2$, $NbSe_2$, $NbTe_2$, $TaS_2$, $TaSe_2$, $TaTe_2$, $TiS_2$, $TiSe_2$, $HfTe_2$, $MoTe_2$, $WTe_2$, $PtSe_2$, $PdSe_2$, $PtTe_2$. To grow the two-dimensional metallic material, similar processes as previously described for the two-dimensional semiconductor material may be adopted.

In some embodiments, the strip 118 of two-dimensional semiconductor material and the adjacent two-dimensional metallic contacts 122, 124 include different materials. In some embodiments, the strip 118 in between the two-dimensional metallic contacts 122, 124 may act as a channel region 130 of a transistor, and the two-dimensional metallic contacts 122, 124 may act as source and drain regions of the transistor. In some embodiments, the interfaces between the two-dimensional metallic contact 122 and the channel region 130 and the two-dimensional metallic contact 124 and the channel region 130 constitute semiconductor-metallic junctions 132, 134, respectively. In some embodiments, the monolayer(s) forming the strip 118 or the layers 126,128 may be considered to extend along an XY plane, so that the semiconductor-metallic junctions 132, 134 extend along the Z direction, for example, in a YZ plane or, more generally, along surfaces extending along the Z direction. Alternatively stated, there is a lateral contact between the channel region 130 and the two-dimensional metallic contacts 122, 124, as opposed to a vertical contact with interfaces extending in the XY plane. For example, the two-dimensional metallic material of the layers 126, 128 contacts opposite side surfaces 118s of the strip 118 of two-dimensional semiconductor material, while the top surface 118t and the bottom surface 118b of the strip 118 may be in contact with the mask strip 108 and the substrate 100, respectively.

Figure 1F:
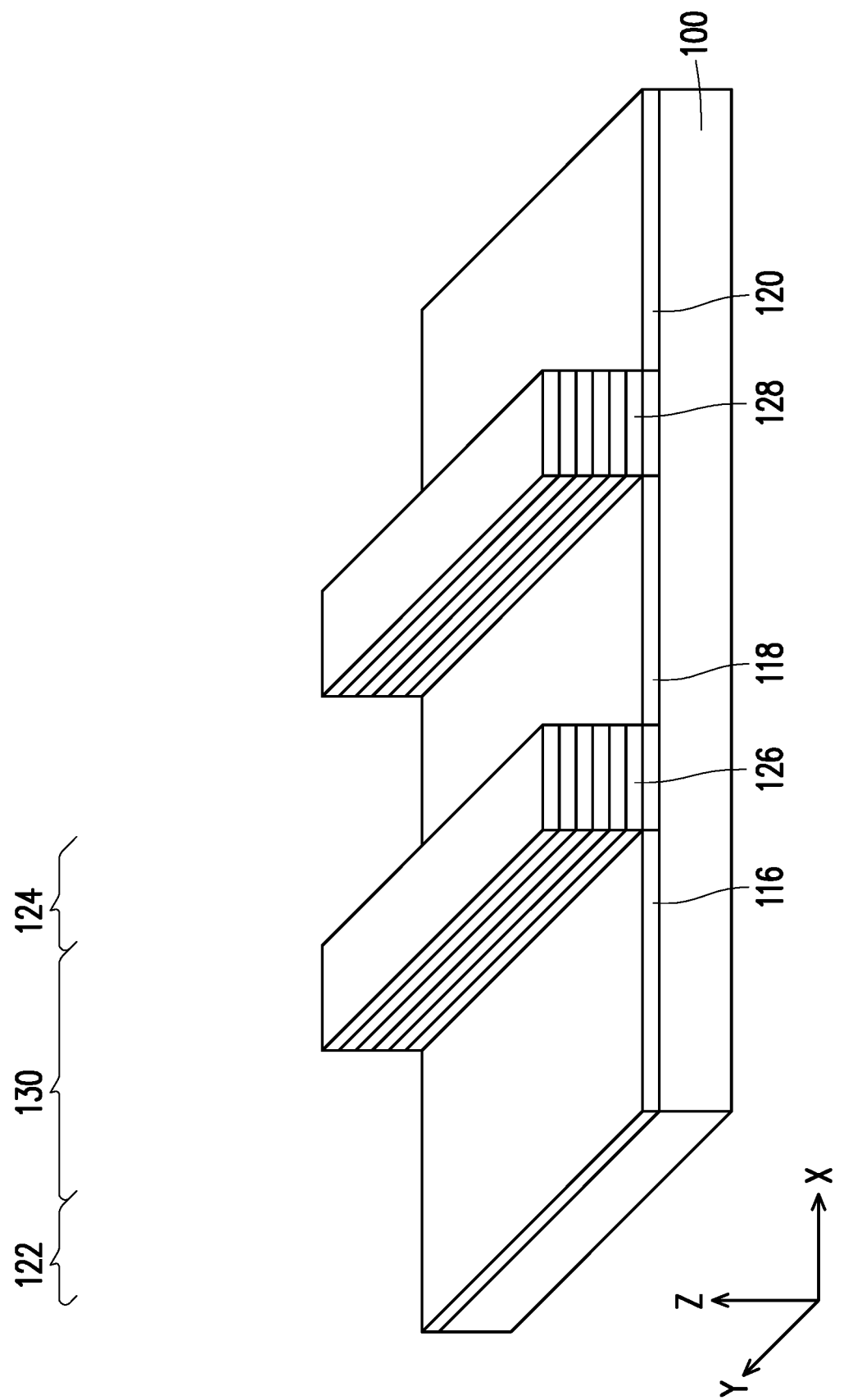
Figure 1G:
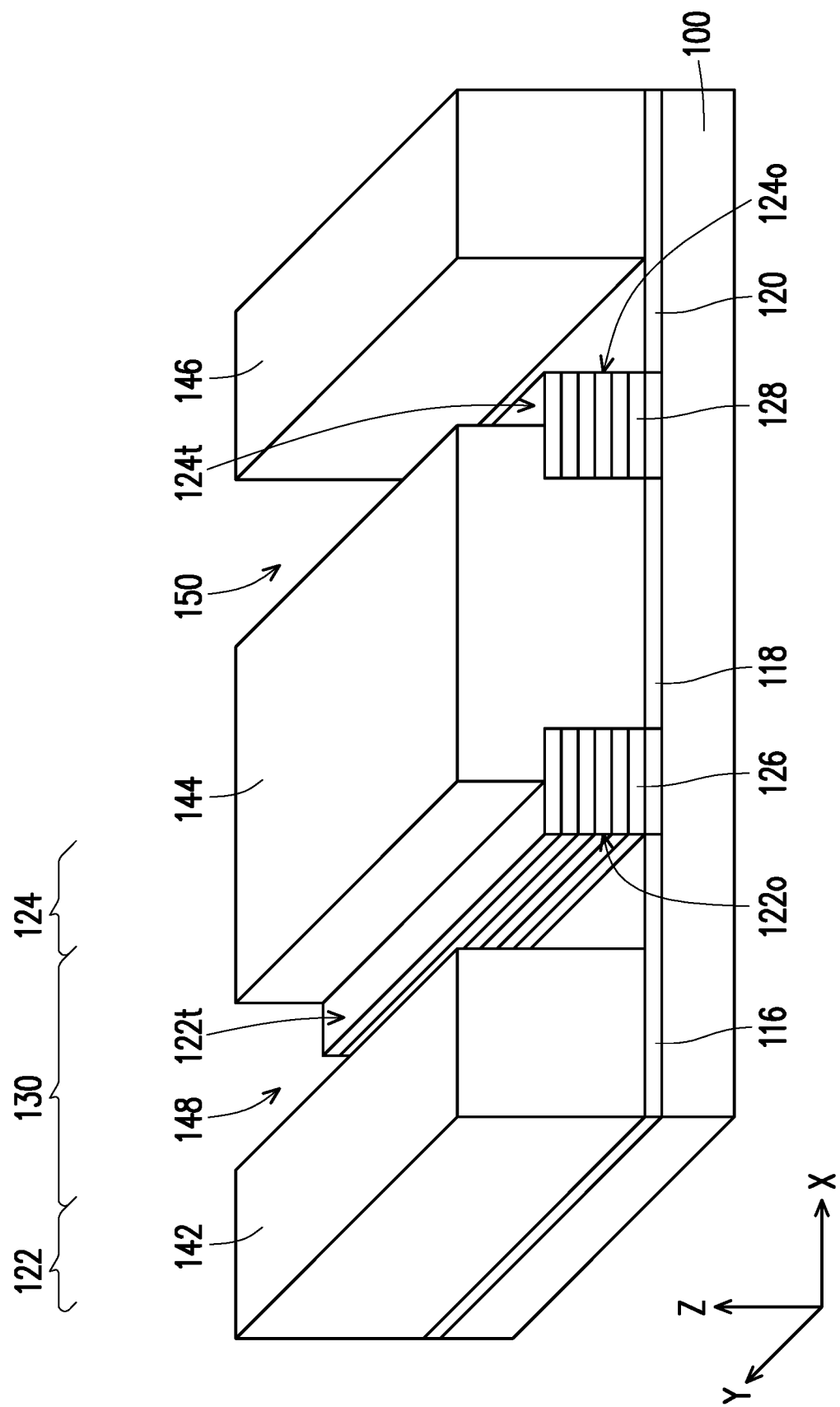
Figure 1H:
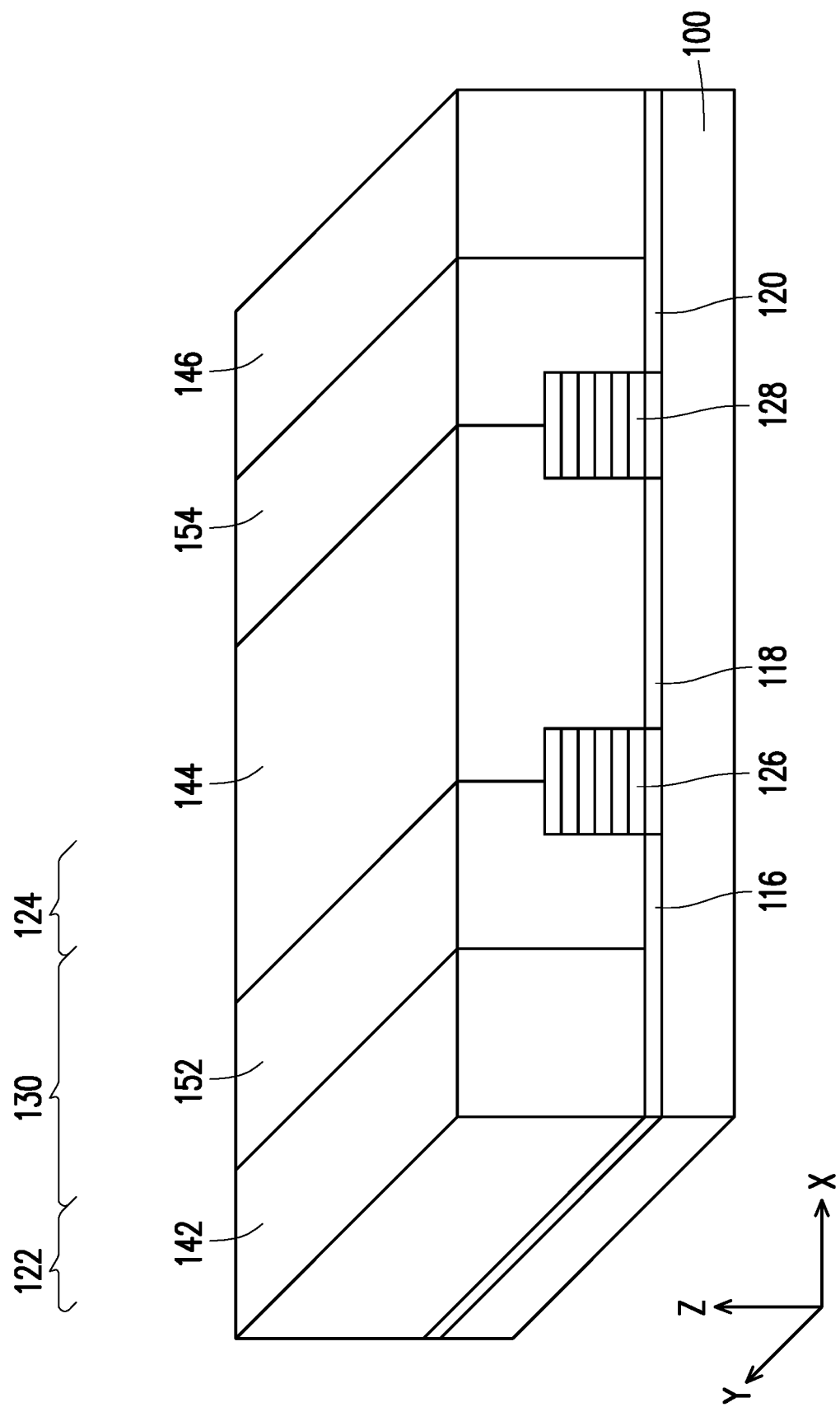
Figure 1I:
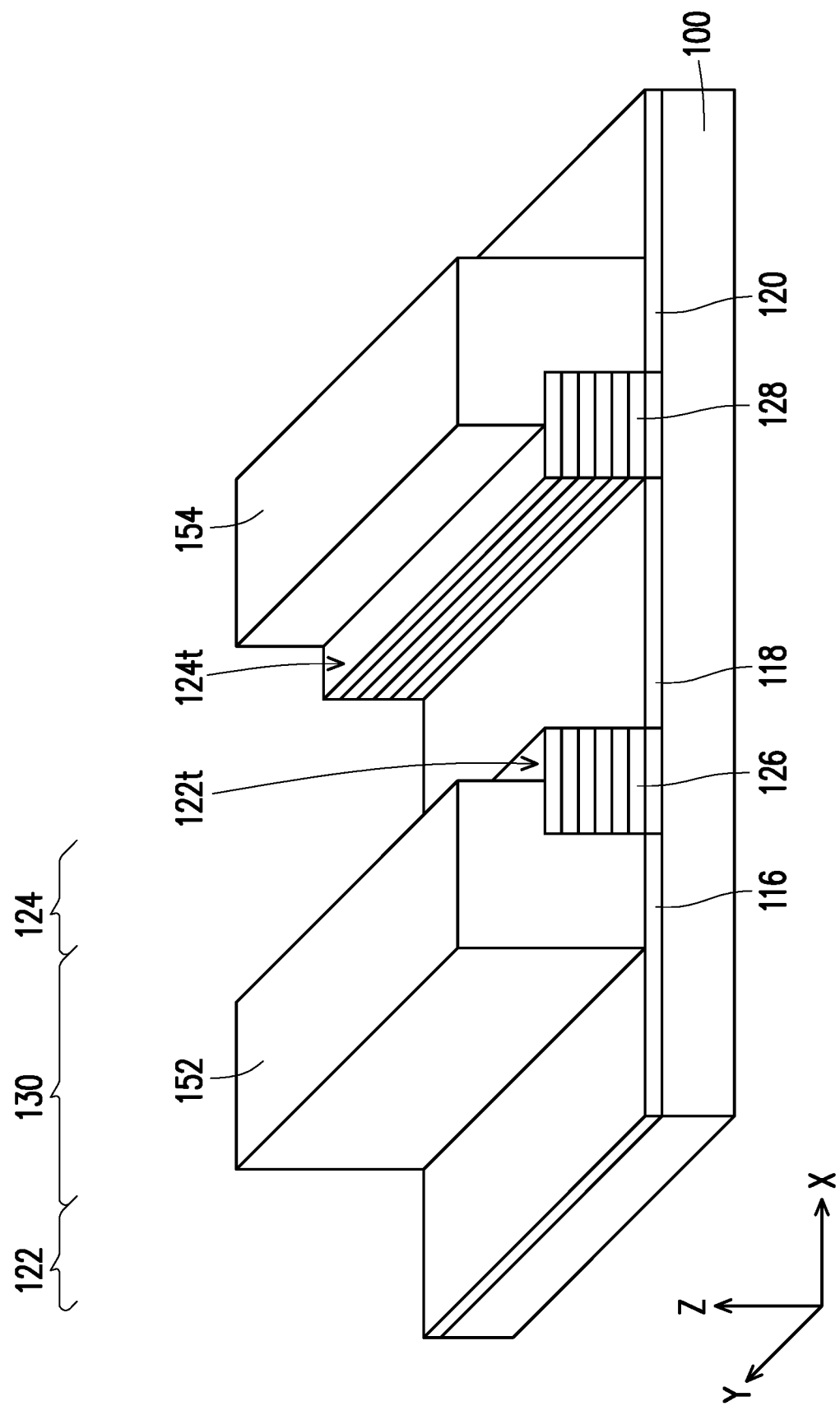
Figure 1J:
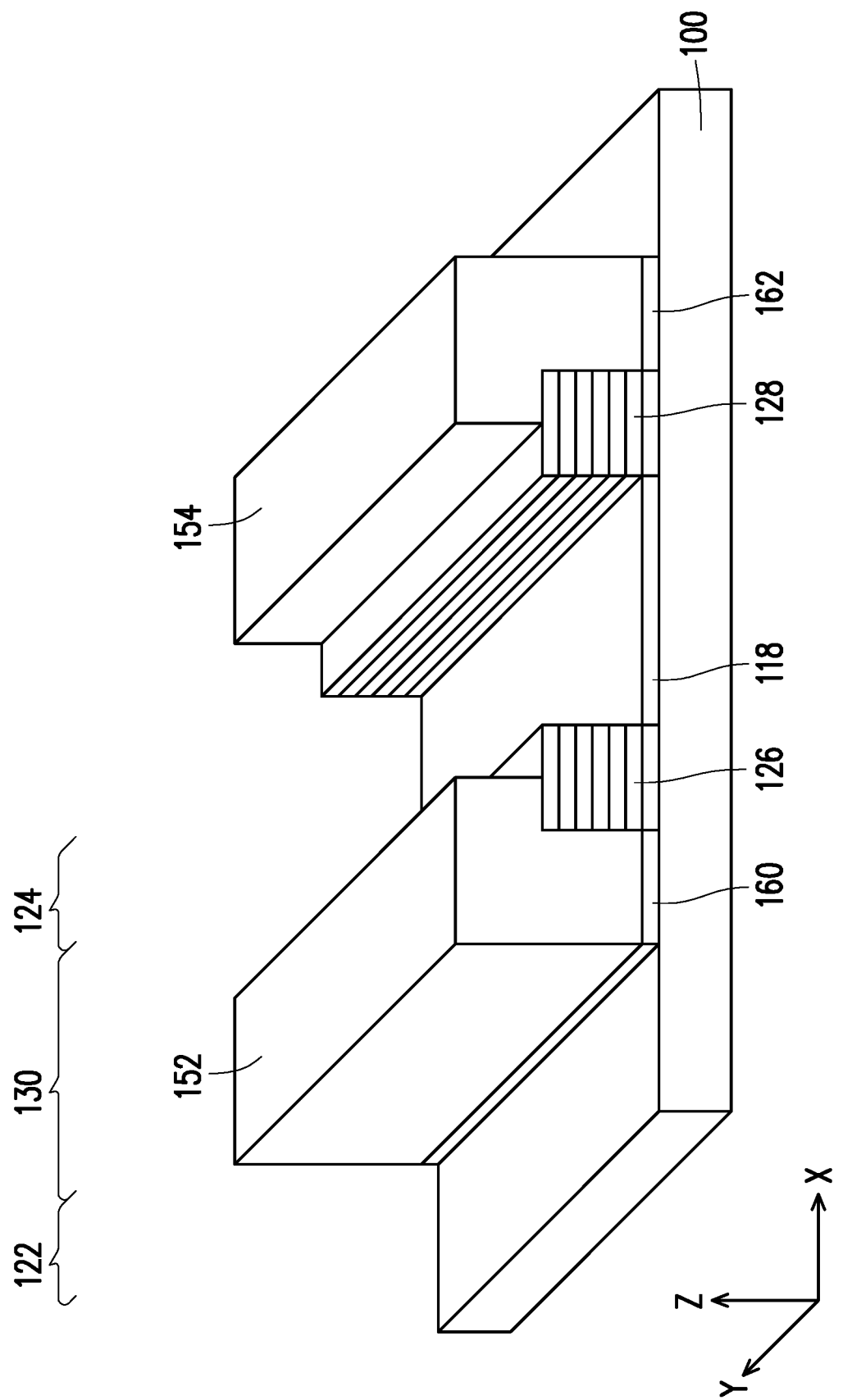
Figure 2F:
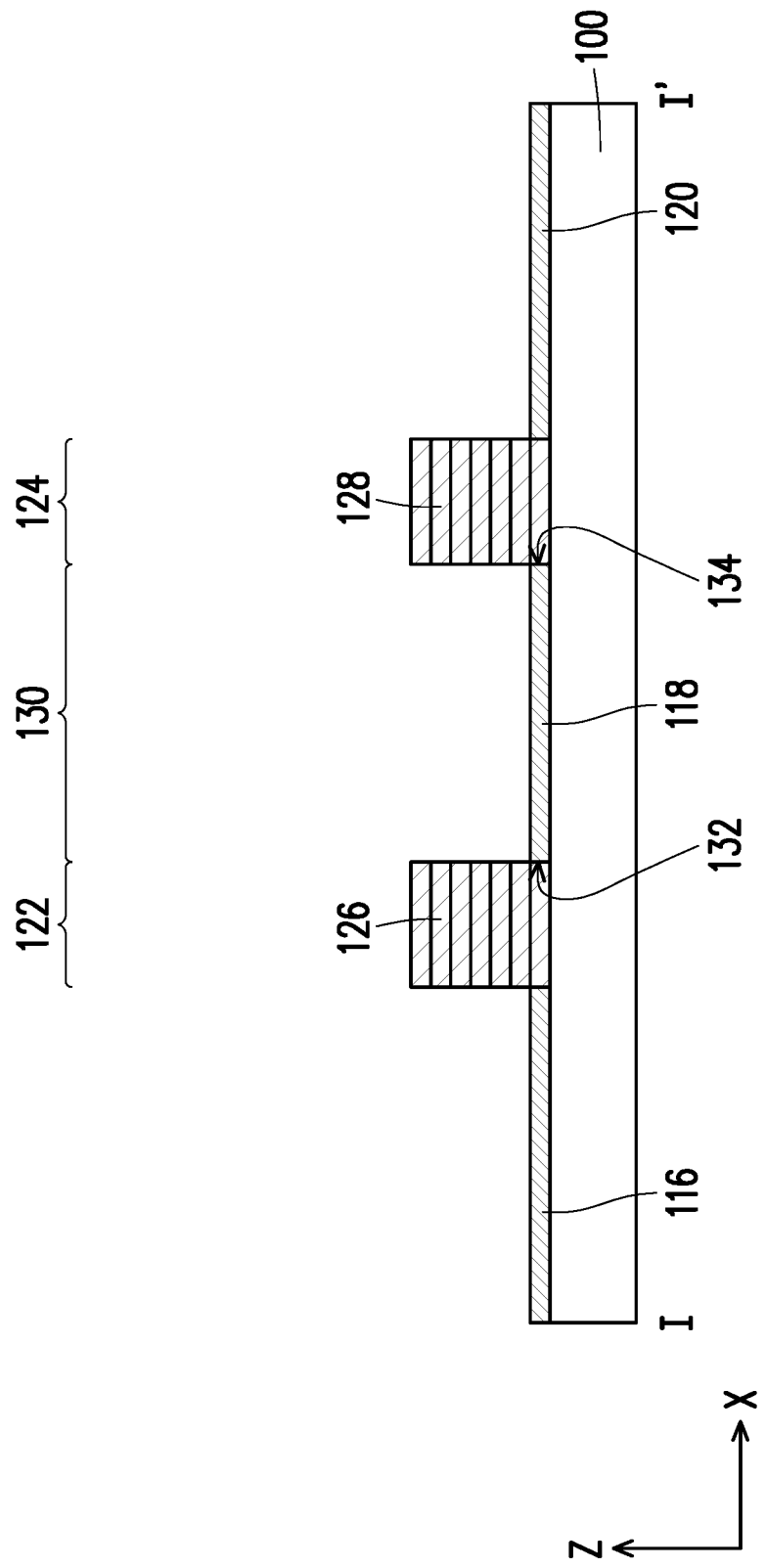
Figure 2G:
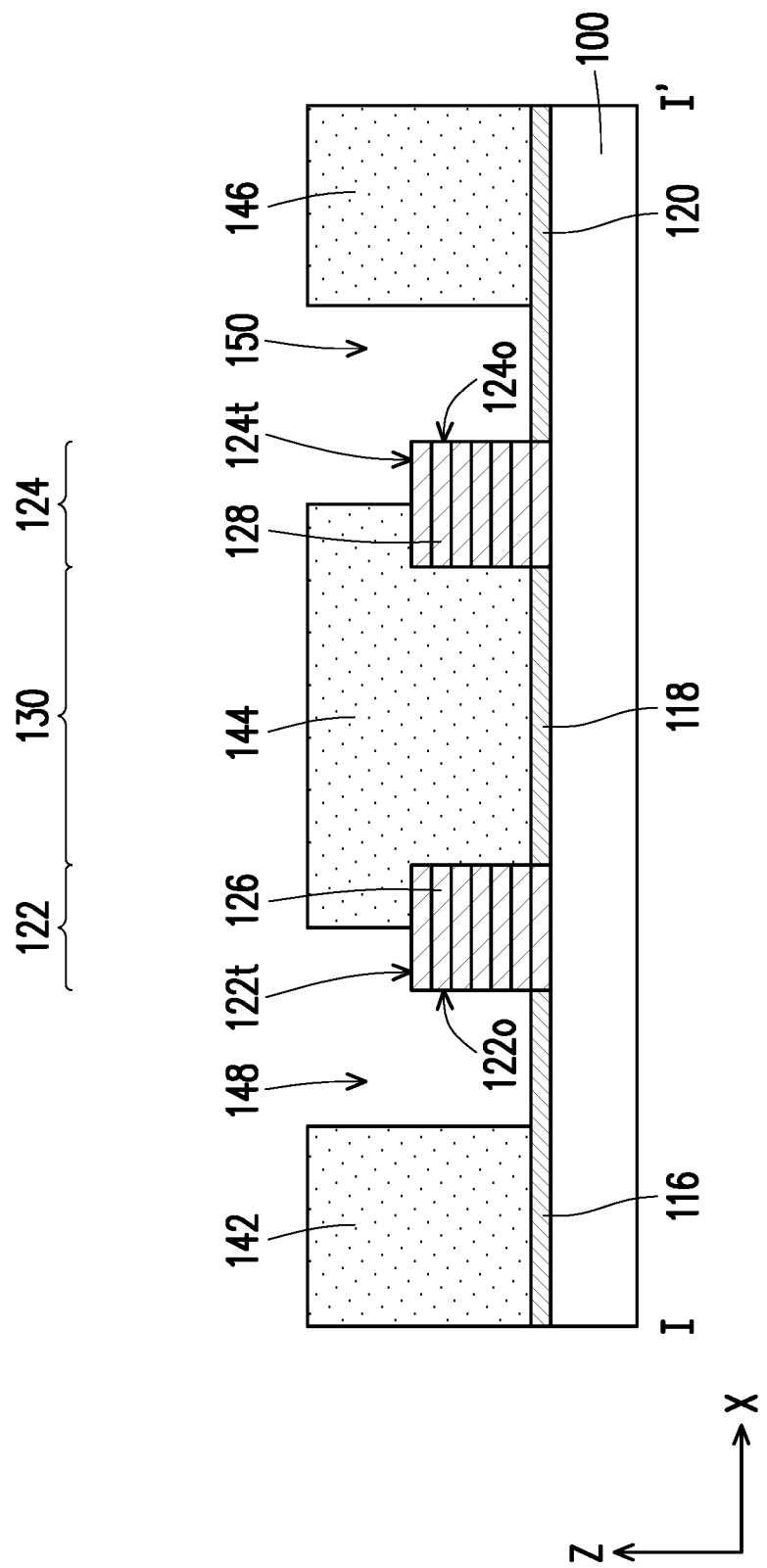
Figure 2H:
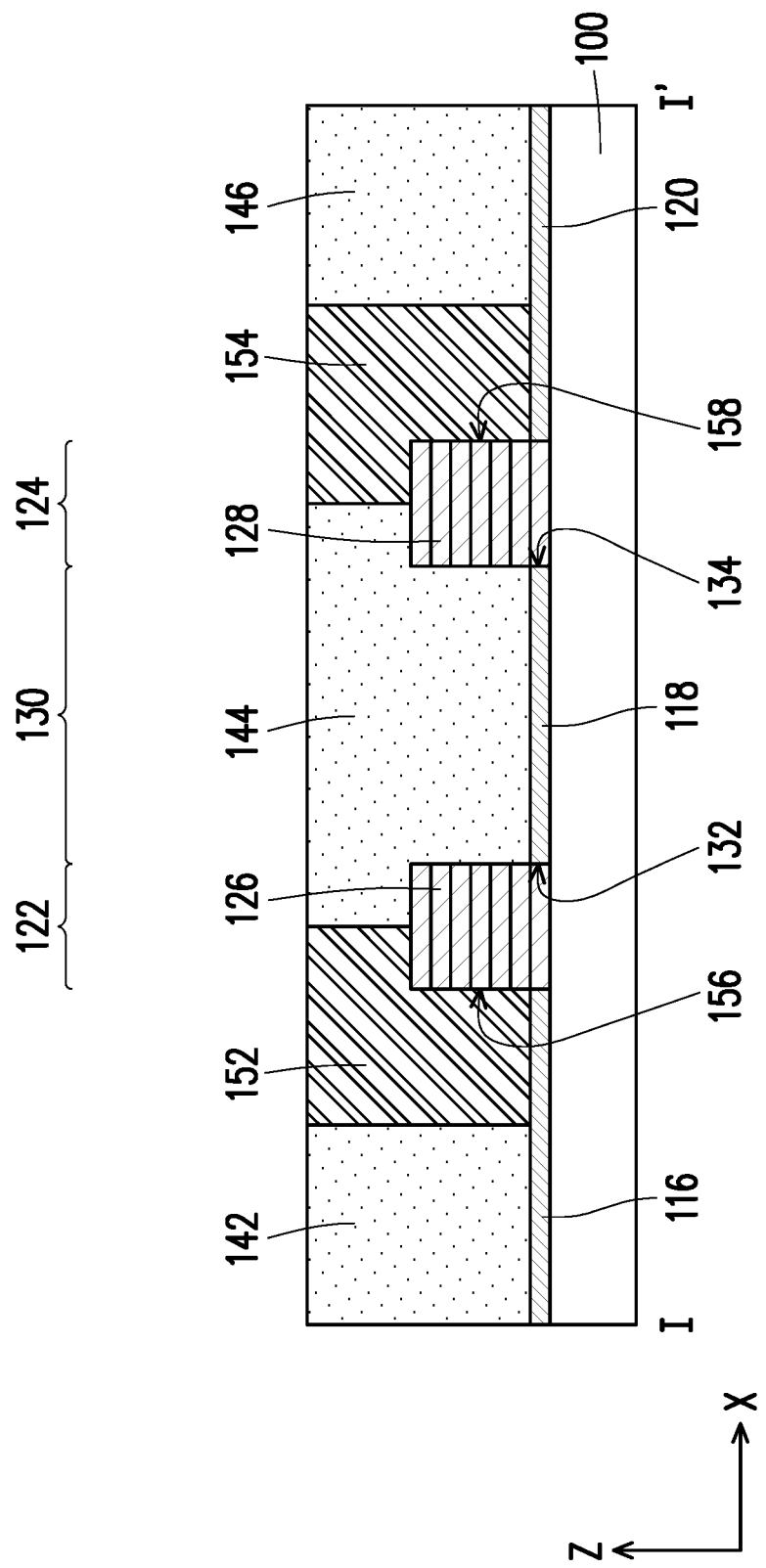
Figure 2I:
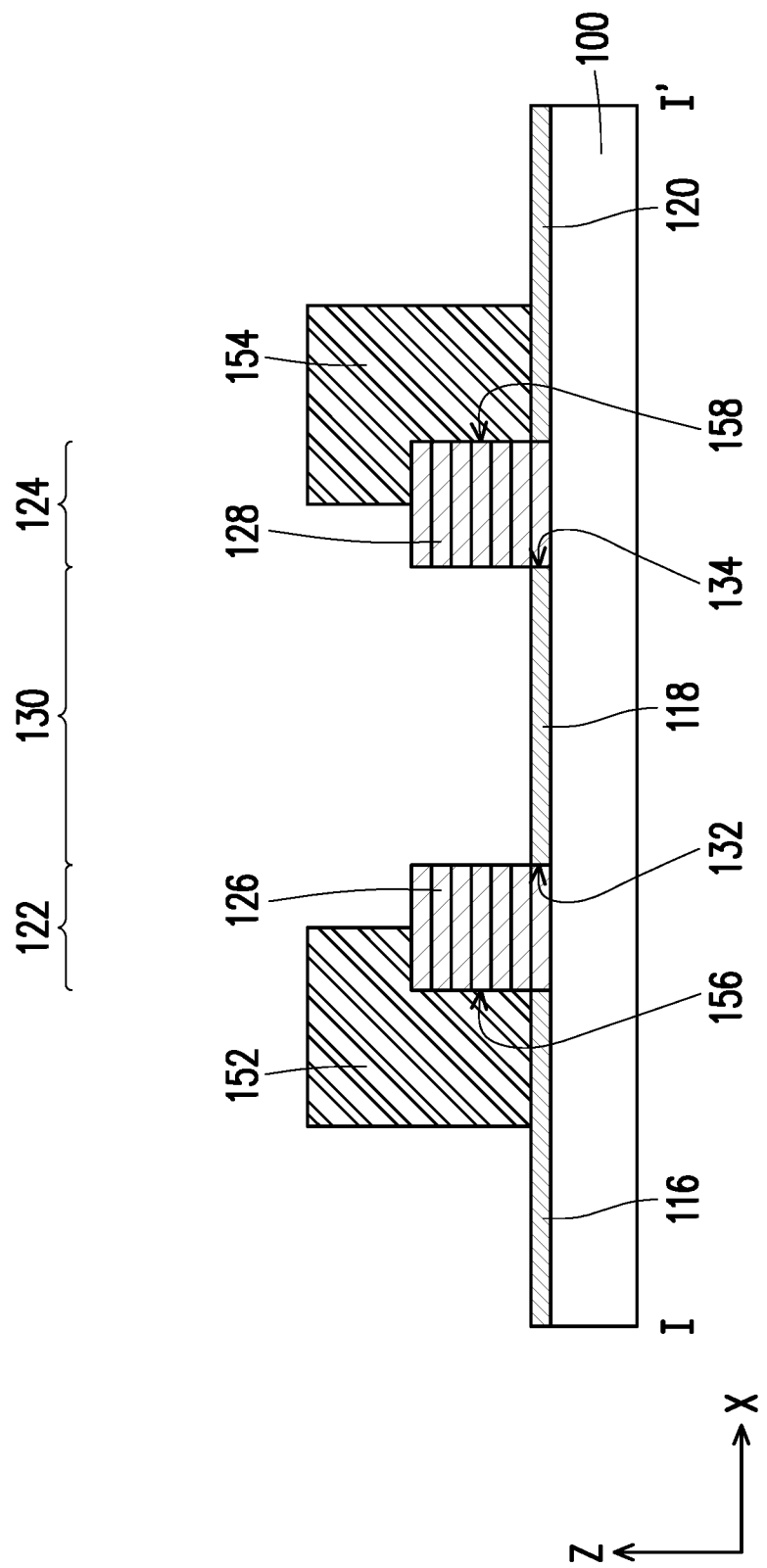
Figure 2J:
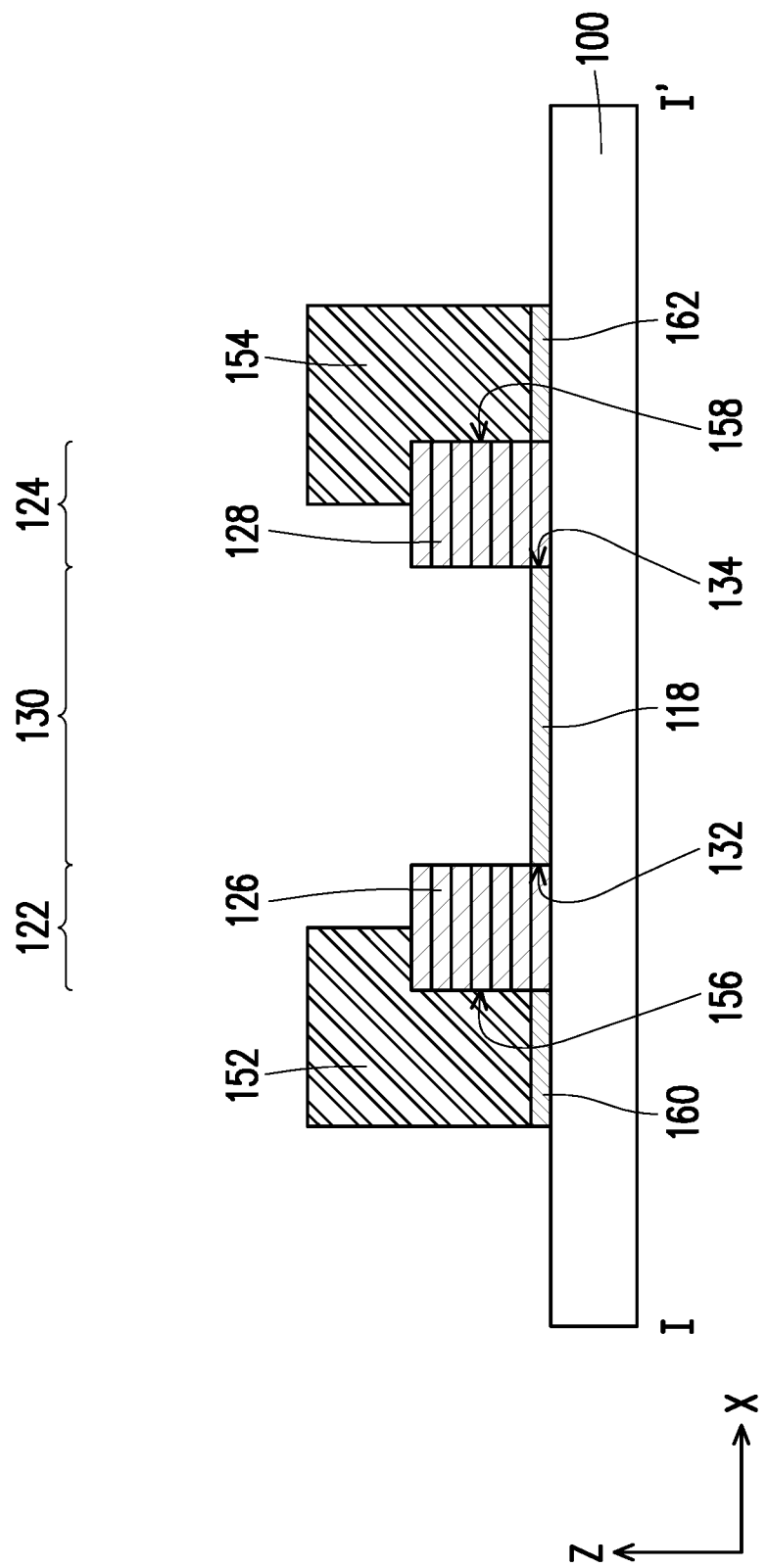

In some embodiments, the mask strips 106, 108, 110 with the overlying portions 136, 138, 140 of two-dimensional metallic material are removed, for example through one or more etching processes. In some embodiments, the etching process may include a buffered oxide etching step. In some alternative embodiments, a planarization process may be performed to remove the overlying portions 136, 138, 140. Upon removal of the mask strips 106, 108, 110, the strips 116, 118, 120 of two-dimensional semiconductor material previously covered are once again exposed, as illustrated in FIG. 1F and FIG. 2F. The layers 126, 128 of the two-dimensional metallic contacts 122, 124, also remain in between the strips 116, 118, 120 of two-dimensional semiconductor material. Thereafter, photoresist strips 142, 144, 146 are respectively formed on the strips 116, 118, 120, as illustrated in FIG. 1G and FIG. 2G. In some embodiments, the photoresist strips 142, 144, 146 extend along the Y direction as the underlying strips 116, 118, 120 of two-dimensional semiconductor material and are separated from each other along the X direction by contact trenches 148, 150. In some embodiments, the photoresist strip 144 located on the strip 118 of two-dimensional semiconductor material in between the two-dimensional metallic contacts 122, 124 fills the gap between the two-dimensional metallic contacts 122, 124, and extend on at least a portion of the topmost monolayers of the layers 126, 128. That is, the photoresist strip 144 may partially extend on top surfaces 122t, 124t of the two-dimensional metallic contacts 122, 124. For example, the contact trench 148 located in between the photoresist strip 142 and the photoresist strip 144 exposes at its bottom the strip 116 of two-dimensional semiconductor material, and, also, an outer sidewall 122o and portion of the top surface 122t of the two-dimensional metallic contact 122. Similarly, the contact trench 150 separating the photoresist strip 144 from the photoresist strip 146 exposes at its bottom the strip 120 of two-dimensional semiconductor material, as well as an outer sidewall 124o and portion of the top surface 124t of the two-dimensional metallic contact 124. In some embodiments, outer sidewalls 122o, 124o are the side surfaces of the two-dimensional metallic contact at an opposite side with respect to the channel region 130. In some embodiments, the patterned photoresist strips 142, 144, 146 are formed through a sequence of deposition, exposure, and development steps.

Referring to FIG. 1G, FIG. 1H, FIG. 2G, and FIG. 2H, in some embodiments, metal contacts 152, 154 are formed in the contact trenches 148, 150, respectively. In some embodiments, the metal contact 152 is disposed on the strip 116 of two-dimensional semiconductor material, and contacts at least the outer sidewall 122o of the two-dimensional metallic contact 122. In some embodiments, the metal contact 152 may further extend on a portion of the top surface 122t of the two-dimensional metallic contact 122. Similarly, the metal contact 154 is disposed on the strip 120 of the two-dimensional semiconductor material, and contacts at least the outer sidewall 124o of the two-dimensional metallic contact 124. In some embodiments, the metal contact 154 may optionally extend on a portion of the top surface 124t of the two-dimensional metallic contact 124. In some embodiments, the outer sidewalls 122o, 124o may correspond to metallic-metal junctions 156, 158 between the metal contacts 152, 154 and the two-dimensional metallic contacts 122, 124, respectively. That is, the contact with the layers 126, 128 of two-dimensional metallic material may happen side-ways, rather than involving the top or bottom surfaces of the layers 126, 128. In some embodiments, the material of the metal contacts 152, 154 includes cobalt (Co), tungsten (W), copper (Cu), titanium (Ti), tantalum (Ta), aluminum (Al), zirconium (Zr), hafnium (Hf), a combination thereof, or other suitable metals or alloys. In some embodiments, the metal contacts 152, 154 may be formed by chemical vapor deposition (CVD), physical vapor deposition (PVD), atomic layer deposition (ALD), plating, other deposition techniques, or a combination thereof. In some embodiments, the material of the metal contacts 152, 154 may initially extend on the photoresist strips 142, 144, 146 as well, and a planarization process (e.g., a chemical mechanical planarization process or the like) may be performed to remove the material in excess, until the photoresist strips 142, 144, 146 are exposed. In some embodiments, the photoresist strips 142, 144, 146 are removed, for example via ashing or stripping. Upon removal of the photoresist strips 142, 144, 146, the strip 118, the portions of the strips 116, 120 not covered by the metal contacts 152, 154, and, possibly, portions of the top surfaces 122t, 124t of the two-dimensional metallic contacts 122, 124, are once again exposed, as illustrated, for example, in FIG. 1I and FIG. 2I. In some embodiments, the portions of the strips 116, 120 protruding from below the metal contacts 152, 154 may be removed, for example during an etching step as previously described, leaving the narrower strips 160, 162 of two-dimensional semiconductor material in between the metal contacts 152, 154 and the substrate 100. In some embodiments, temporary protective masks (not shown) may be used to protect the strip 118 of two-dimensional semiconductor material during formation of the strips 160, 162 of two-dimensional semiconductor material. In some embodiments, the footprints of the strips 160, 162 of two-dimensional semiconductor material coincide with the span of the portions of the corresponding metal contacts 152, 154 not stacked on the two-dimensional metallic contacts 122, 124.

Figure 1K:
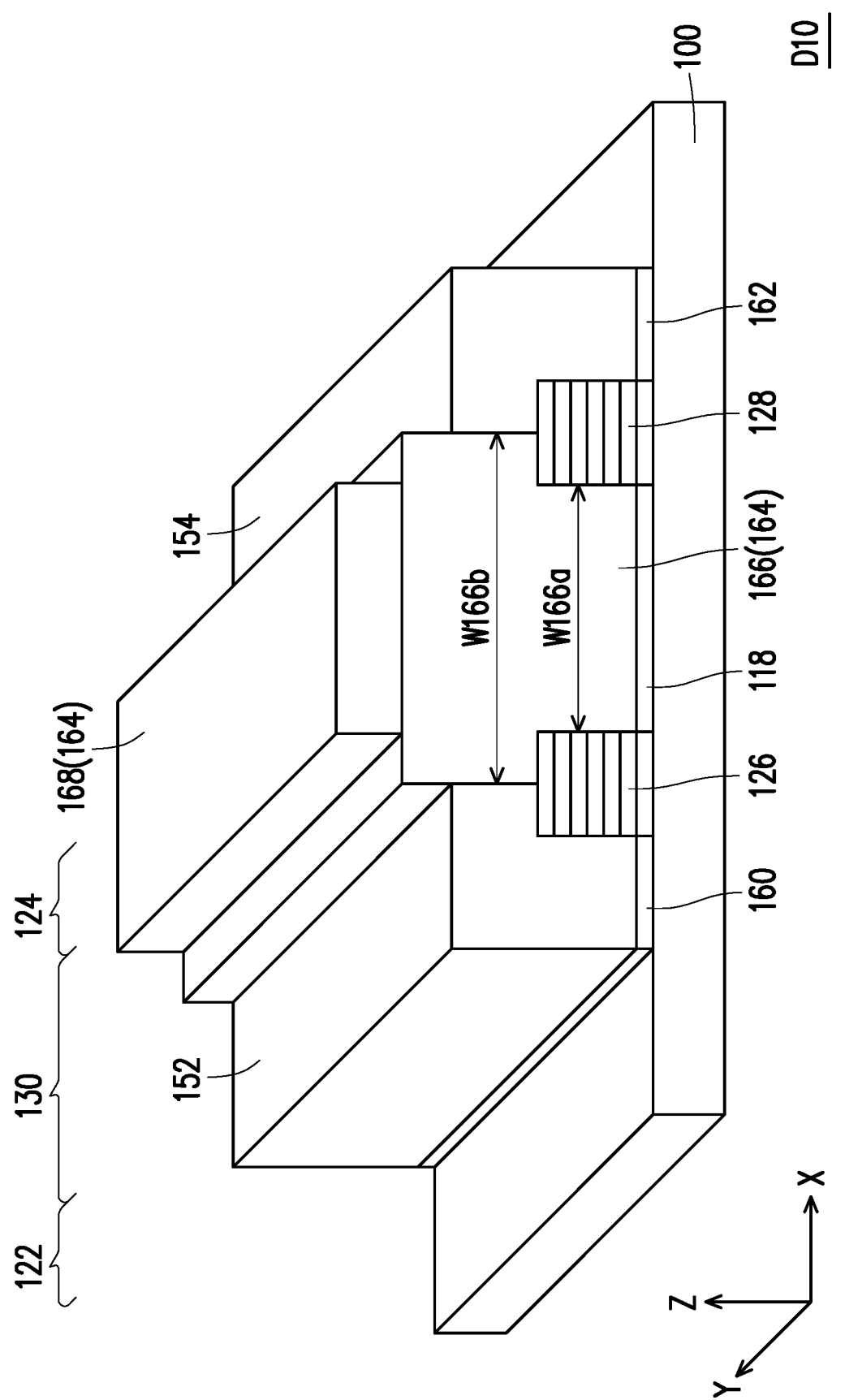
Figure 2K:
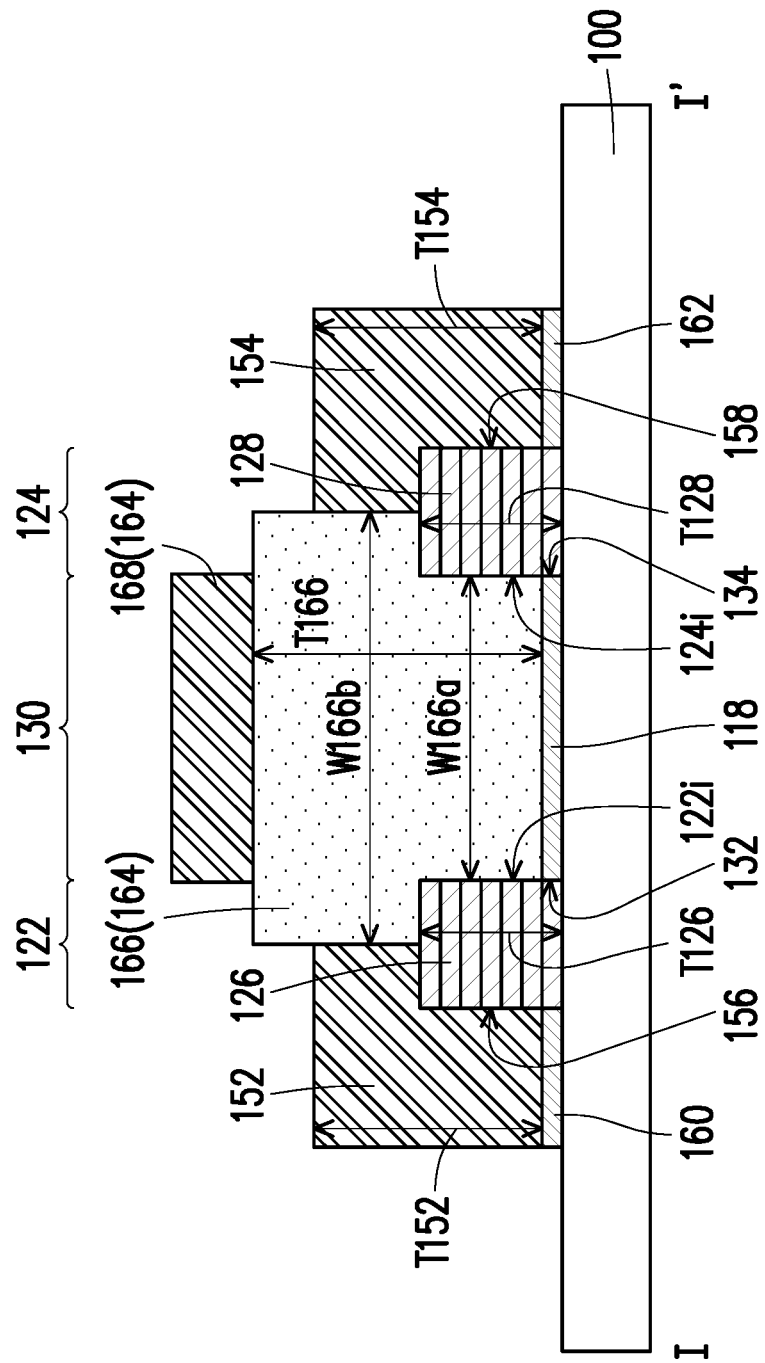

Referring to FIG. 1K and FIG. 2K, in some embodiments, a gate structure 164 is formed on the strip 118 of the channel region 130, in between the two-dimensional metallic contacts 122, 124. In some embodiments, the gate structure 164 completely covers the strip 118. In some embodiments, the gate structure 164 fills the space in between the two-dimensional metallic contacts 122, 124. In some embodiments, the gate structure 164 contacts inner sidewalls 122i, 124i of the two-dimensional metallic contacts 122, 124, where the inner sidewalls 122i, 124i are opposite to the metallic-metal junctions 156, 158 with the metal contacts 152, 154. In some embodiments, the gate structure 164 may further extend on the portions of the top surfaces 122t, 124t left exposed by the metal contacts 152, 154. In some embodiments, the gate structure 164 includes gate dielectric layer 166 and a gate metal layer 168 sequentially stacked. In some embodiments, it is the gate dielectric layer 166 that extends on the strip 118 of two-dimensional semiconductor material and on the two-dimensional metallic contacts 122, 124. In some embodiments, the gate dielectric layer 166 further extends on the top surfaces 122t, 124t of the two-dimensional metallic contacts 122, 124 up to the metal contacts 152, 154. For example, the gate dielectric layer 166 may have a width W166a along the X direction in between the two-dimensional metallic contacts 122, 124, and a width W166b greater than the width W166a in between the metal contacts 152, 154. In some embodiments, a thickness T166 along the Z direction of the gate dielectric layer 166 is greater than the thicknesses T126, T128 of the two-dimensional metallic contacts 122, 124 and is also greater than the thicknesses T152, T154 of the metal contacts 152, 154. In some embodiments, the thicknesses T152, T154, T166 may independently be in the range from 30 to 100 nanometers. In some embodiments, a ratio of the thickness T126 (or T128) to the thickness T152 may be in the range from 0.07 to 0.3. In some embodiments, a ratio of the thickness T126 (or T128) to the thickness T166 may be in the range from 0.06 to 0.2. In some embodiments, a ratio of the thickness T152 to the thickness T166 may be in the range from 0.3 to 1.6. In some embodiments, the gate metal layer 168 may be formed as a strip pattern running on the gate dielectric layer 166. The gate dielectric layer 166 may separate the gate metal layer 168 from the strip 118 of two-dimensional semiconductor material, the two-dimensional metallic contacts 122, 124, and the metal contacts 152, 154.

In some embodiments, the gate dielectric layer 166 may be a composite layer, including an interface dielectric layer and a high-k dielectric layer stacked on the interface dielectric layer. In some embodiments, the interface dielectric layer may include a dielectric material such as silicon oxide or silicon oxynitride. In some embodiments, the high-k dielectric layer has a dielectric constant greater than about 4, greater than about 12, greater than about 16, or even greater than about 20. For example, a material of the high-k dielectric layer may include a metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, $SrTiO_3$ (STO), $BaTiO_3$ (BTO), BaZrO, HfZrO, HfLaO, HfTaO, HfiO, a combination thereof, or other suitable materials. The gate metal layer 168 may include a work function material and a gate electrode material. In some embodiments, the work function material and the gate electrode material are sequentially deposited over the gate dielectric layer 166. In some embodiments, the work function material may be selected according to the conductivity type desired for the transistor to adjust a threshold voltage of the transistor. For example, p-type work function materials include TiN, TaN, Ru, Mo, Al, WN, $ZrSi_2$, $MoSi_2$, $TaSi_2$, $NiSi_2$, WN, other suitable p-type work function materials, or combinations thereof. On the other hand, n-type work function materials include, for example, Ti, Ag, TaAl, TaAlC, TiAlN, TaC, TaCN, TaSiN, Mn, Zr, other suitable n-type work function materials, or combinations thereof. In some embodiments, the gate electrode material includes titanium (Ti), tantalum (Ta), tungsten (W), aluminum (Al), zirconium (Zr), hafnium (Hf), titanium aluminum (TiAl), tantalum aluminum (TaAl), tungsten aluminum (WAl), zirconium aluminum (ZrAl), hafnium aluminum (HfAl), titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), any other suitable metal-containing material, or a combination thereof. In some embodiments, the method of providing the work function material and/or the gate electrode material includes performing at least one suitable deposition technique, such as CVD, PECVD, ALD, RPALD, PEALD, MBD, or the like.

Figure 3:
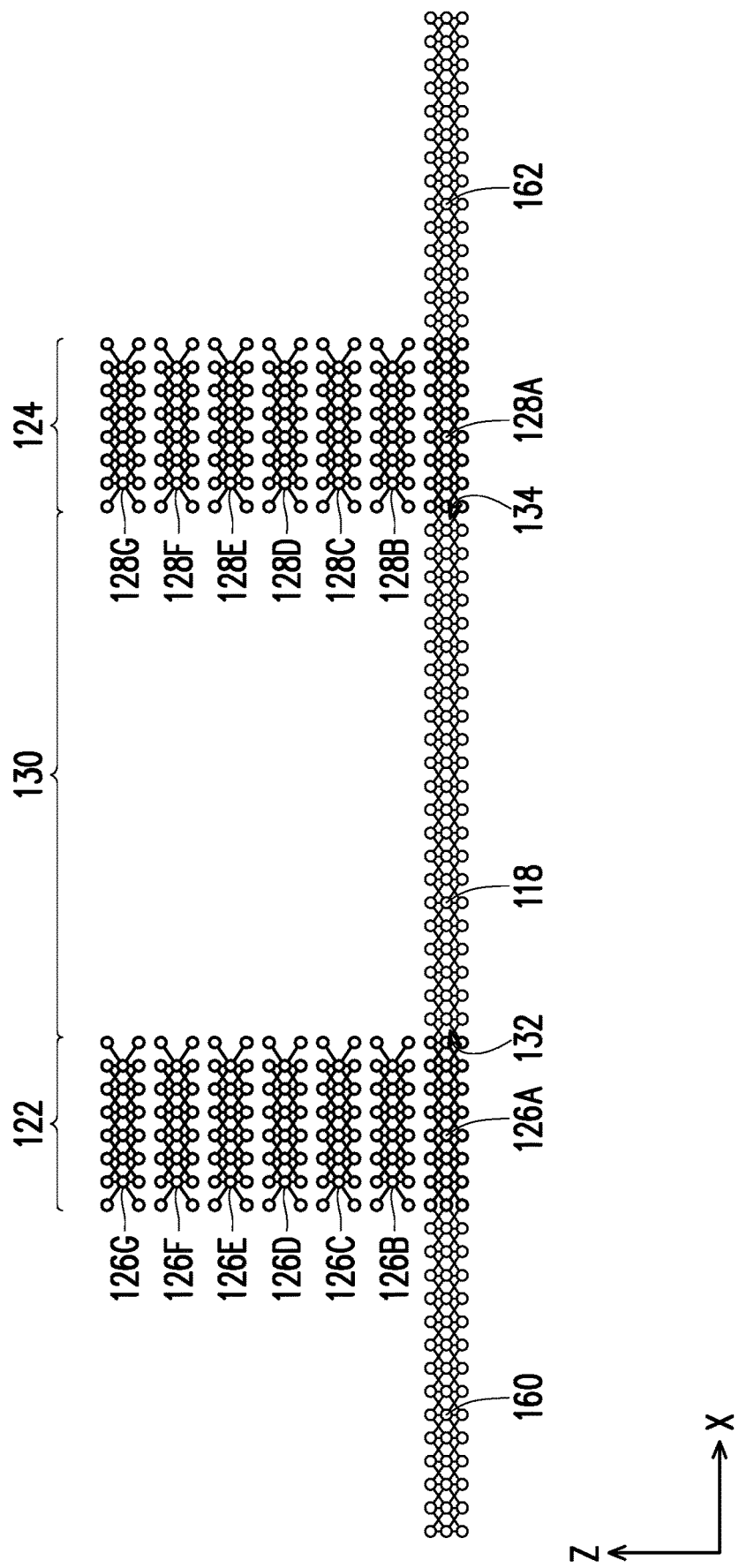
FIG. 3 is a schematic representation of components of the semiconductor device according to some embodiments of the disclosure.

FIG. 3 is a schematic view of the strips 118, 160, 162 of two-dimensional semiconductor material and the layers 126, 128 of the two-dimensional metallic contacts 122, 124. Referring to FIG. 1K, FIG. 2K, and FIG. 3, in the semiconductor device D10, the channel region 130 of a transistor is formed by the strip 118 of two-dimensional semiconductor material. At opposite ends of the strip 118 of two-dimensional semiconductor material are formed the two-dimensional metallic contacts 122, 124. In some embodiments, the strip 118 of two-dimensional semiconductor material includes a different material than the layers 126, 128 of the two-dimensional metallic contact. The interfaces between the strip 118 of two-dimensional semiconductor material and the two-dimensional metallic contacts 122, 124 are semiconductor-metallic junctions 132, 134. In some embodiments, two-dimensional materials are used for the channel region 130 and the two-dimensional metallic contacts 122, 124, and the semiconductor-metallic junctions 132, 134 have a horizontal geometry (e.g., along the X direction), thus lowering the contact resistance due to a van der Waals gap existing when a two-dimensional material is contacted vertically (e.g., along the Z direction). For similar reasons, the later contact between the metal of the metal contacts 152, 154 and the two-dimensional metallic material of the two-dimensional metallic contacts 122, 124 may reduce or even avoid contact resistance at the metallic-metal junctions 156, 158.

In some embodiments, it is possible that the two-dimensional metallic material of the layers 126, 128 (covalently) bonds at the interface with the two-dimensional semiconductor material of the channel region 130. For example, in FIG. 3 is illustrated the structure in the case in which both the two-dimensional metallic material and the two-dimensional semiconductor material are transition metal dichalcogenides. For example, $MoS_2$ may be used as the two-dimensional semiconductor material and $PtSe_2$ may be used as the two-dimensional metallic material. In some embodiments, in a monolayer of transition metal dichalcogenide, a layer of atoms of the transition metal may be sandwiched in between layers of chalcogen atoms. In some embodiments, a van der Waals gap separate the monolayer of transition metal dichalcogenide from the overlying element, be it another monolayer of transition metal dichalcogenide, the material of the gate dielectric layer 166, or the metal of the metal contacts 152, 154. In some embodiments, the strips 118, 160, 162 of two-dimensional semiconductor material may include a single monolayer of two-dimensional semiconductor material, and such single monolayer may be substantially coplanar along the Z direction (e.g., aligned in the XY plane) with the bottommost monolayers 126A, 128A of the layers 126, 128 of the two-dimensional metallic contacts 122, 124. In some embodiments, the bottommost monolayers 126A, 128A of two-dimensional semiconductor material may be (covalently) bonded to the single monolayer of two-dimensional semiconductor material, while the upper monolayers 126B-G, 128B-G may be stacked over the respective bottommost monolayer 126A or 128A. In some embodiments, the number of monolayers 126A-G, 128A-G of two-dimensional metallic material in a two-dimensional metallic contact 122, 124 is greater than the number of monolayers of two-dimensional semiconductor material in the channel region 130. In some embodiments, the number of monolayers 126A-G, 128A-G in a two-dimensional metallic contact 122 or 124 is not particularly limited, and may be selected to tune the properties of the two-dimensional metallic contact 122 or 124.

Figure 4A:
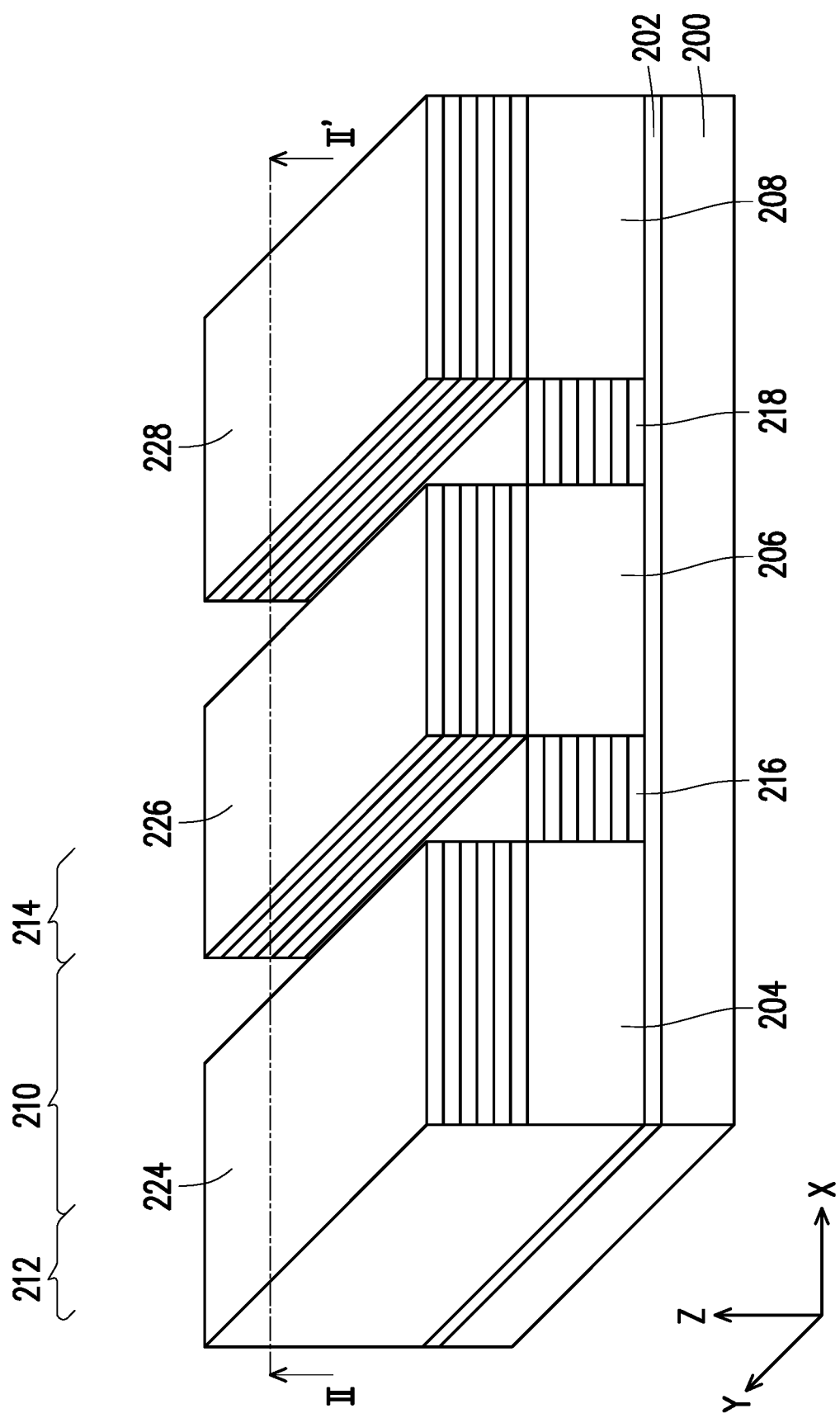
FIG. 4A and FIG. 4B are schematic perspective views of structures formed during a manufacturing process of a semiconductor device according to some embodiments of the disclosure.
Figure 4B:
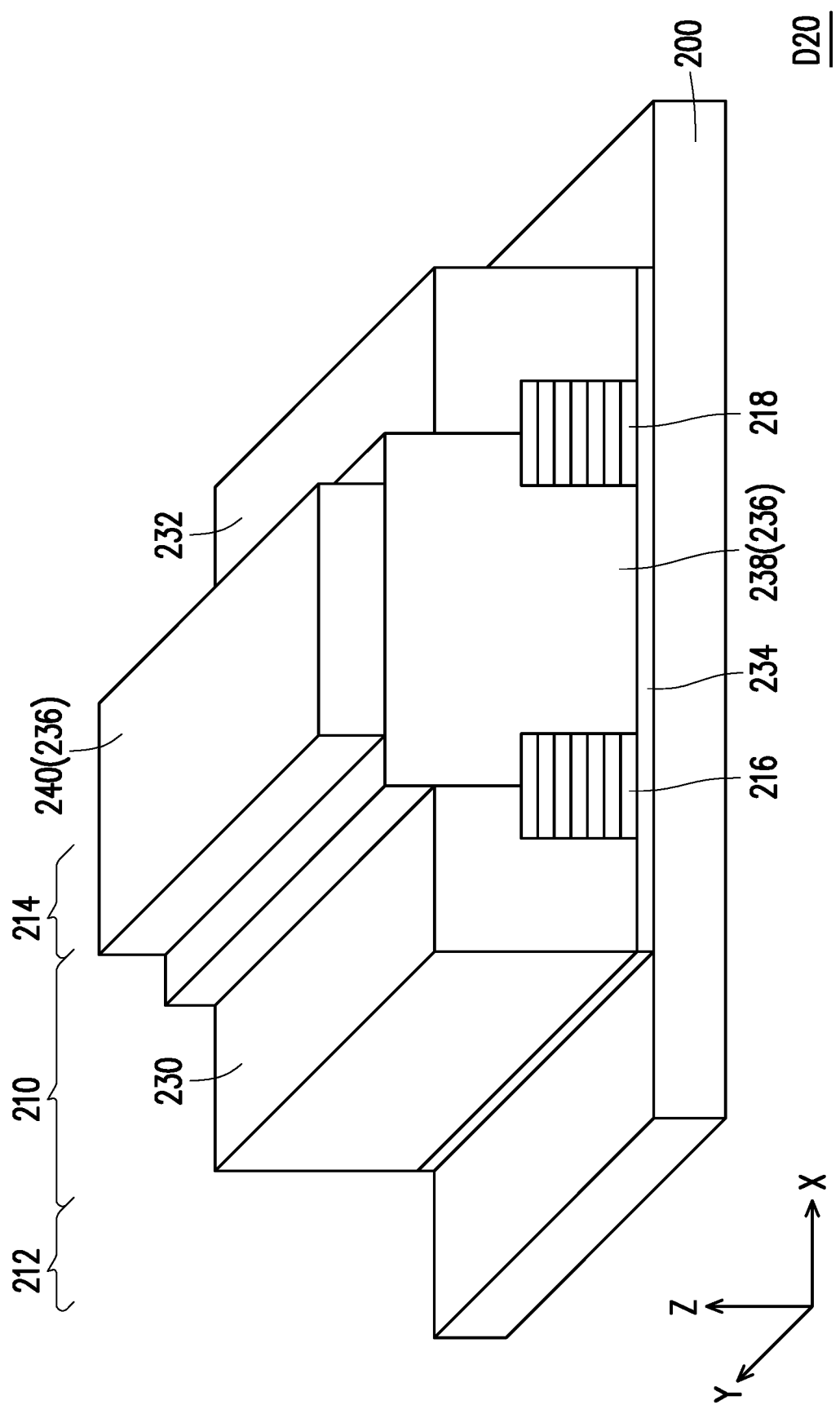
Figure 5A:
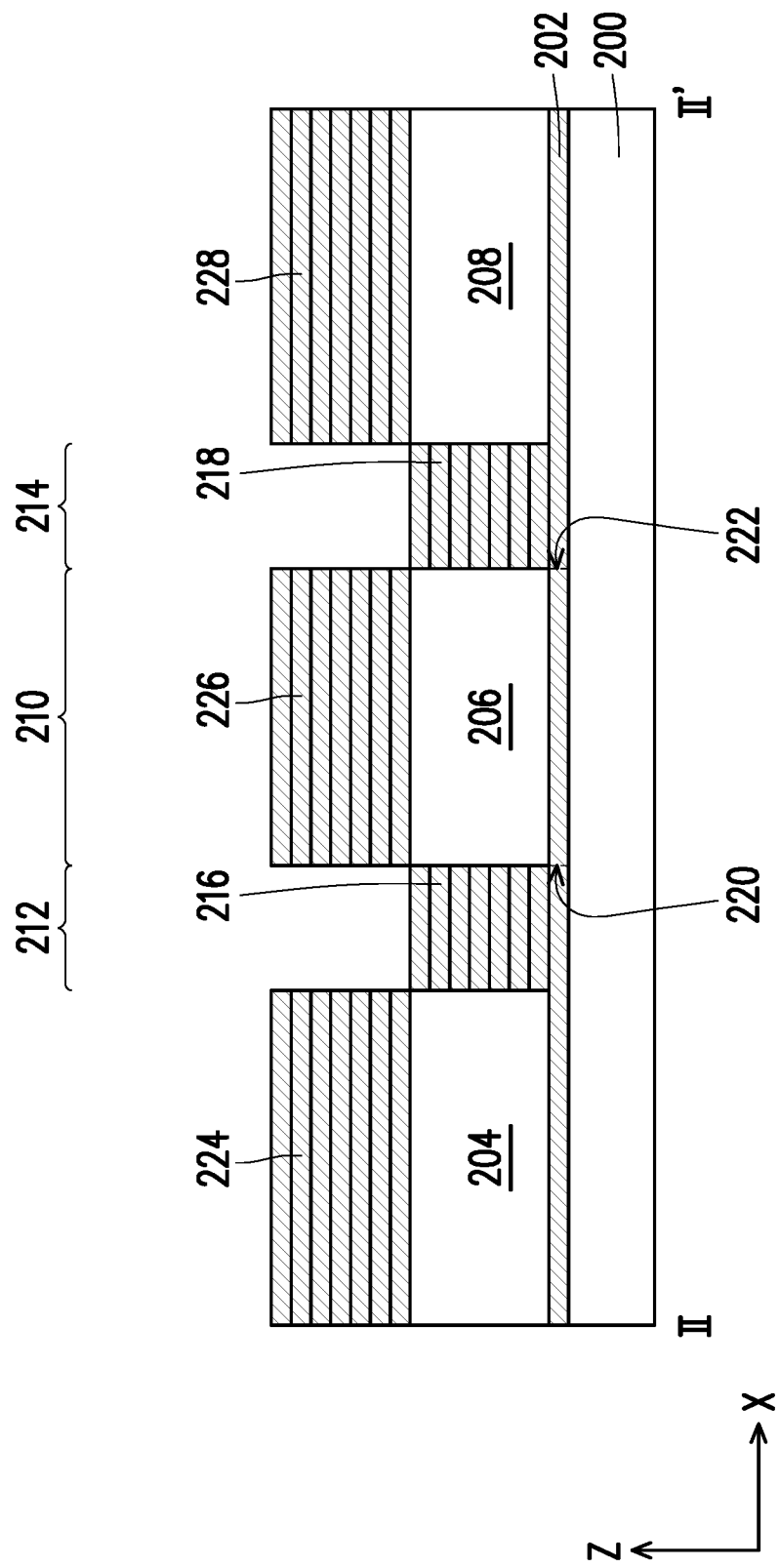
FIG. 5A and FIG. 5B are schematic cross-sectional views of the structures illustrated in FIG. 4A and FIG. 4B, respectively, according to some embodiments of the disclosure.
Figure 5B:
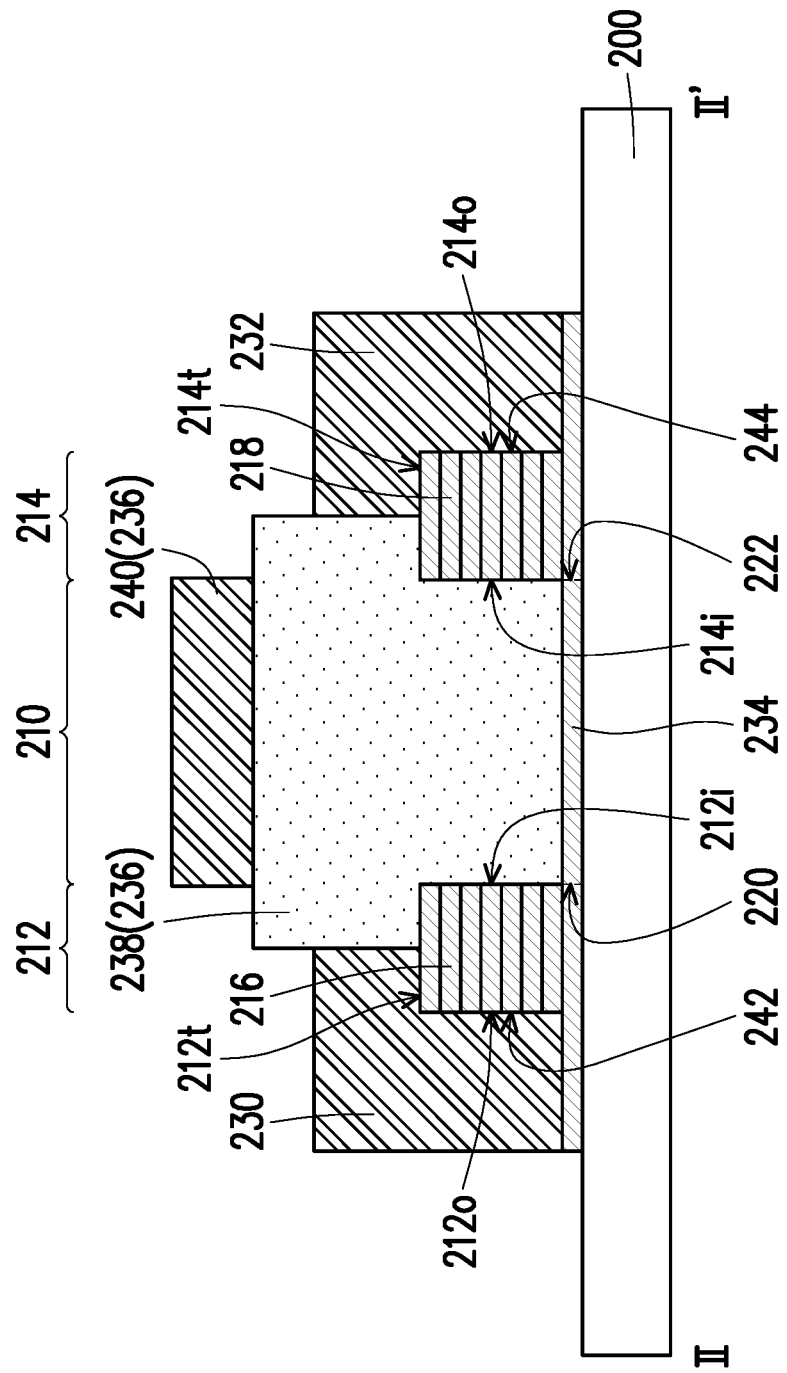

FIG. 4A and FIG. 4B are schematic perspective views of structures formed during manufacturing of a semiconductor device D20 according to some embodiments of the disclosure. FIG. 5A and FIG. 5B are schematic cross-sectional views of the structures of FIG. 4A and FIG. 4B, respectively, taken in an XZ plane at the level height of the line II-II' along the Y direction. In some embodiments, the structure of FIG. 4A may be formed following similar processes as previously described with reference to FIG. 1A to FIG. 2C, FIG. 1E, and FIG. 2E. Briefly, on the substrate 200, the sheet 202 of two-dimensional semiconductor material is formed, followed by the mask strips 204, 206, 208, to obtain a structure similar to the one illustrated in FIG. 1C and FIG. 2C. As previously described, the steps may be performed at the FEOL level or the BEOL level, according to the desired structure. In some embodiments, the sheet 202 of two-dimensional semiconductor material may include a thickness-modulated switchable material, that is, a material, such as $PtSe_2$, $PdSe_2$, or $PtTe_2$, that switches electronic character according to the number of monolayers stacked. For example, in the case of $PtSe_2$, when one or few monolayers (in some embodiments, about five layers) are stacked on each other, the layer stack has semiconducting properties, while when more monolayers are stacked (in some embodiments, about six layers or more), the layer stack has metallic properties. In some embodiments, one of such thickness-modulated switchable material may be used both as the two-dimensional semiconductor material for the channel region 210 and as the two-dimensional metallic material of the two-dimensional metallic contacts 212, 214, adjusting the thickness (e.g., the number of monolayers in the sheet 202 and in the layers 216, 218) according to the desired electronic properties. That is, the channel region 210 and the two-dimensional metallic contacts 212, 214 may include the same material. In some embodiments, the above-mentioned thickness-modulated switchable materials may be conveniently prepared, for example by CVP, PVD, ALD, or MBE, by reaction of a precursor for the transition metal atom and another precursor for the chalcogen atom. As precursors of the transition metal atom, the neat metal (e.g., Pt or Pd), its chlorides (e.g., $PtCl_2$, $PtCl_4$, $PdCl_2$), or its oxides (e.g., $PtO_2$, PdO) may be used. As precursor of the chalcogen atom, the elemental chalcogen (e.g., Se or Te) or the hydrogen chalcogenide (e.g., $H_2Se$, $H_2Te$) may be used. In some embodiments, when chlorides and elemental chalcogens are used as precursors, deposition of the thickness-modulated switchable material may be achieved at temperature below 500° C., for example in the range from 300° C. to 400° C., for example via PVD. In some alternative embodiments, the thickness-modulated switchable material may be deposited using as a source the thickness-modulated switchable material in bulk form.

Figure 6:
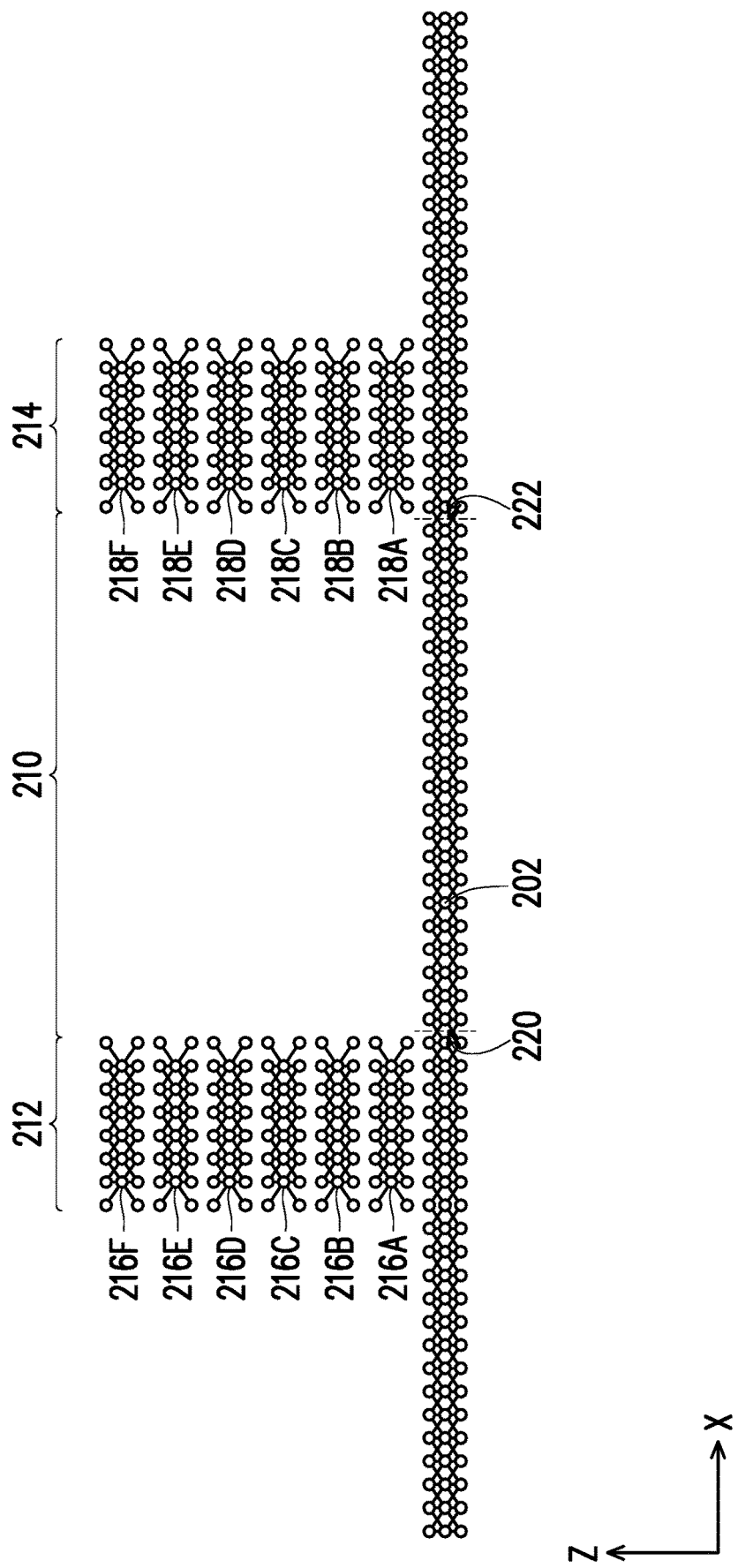
FIG. 6 is a schematic representation of components of a semiconductor device according to some embodiments of the disclosure.

FIG. 6 is a schematic view of the sheet 202 of the channel region 210 and the layers 216, 218 of the two-dimensional metallic contacts 212, 214. Referring to FIG. 4A, FIG. 5A, and FIG. 6, in some embodiments, the sheet 202 of two-dimensional semiconductor material includes the thickness-modulated switchable material, in a number of monolayers such that the thickness-modulated switchable material has semiconducting properties. The monolayers 216A-F, 218A-F of the two-dimensional metallic material also include the same thickness-modulated switchable material, and are formed on portions of the sheet 202 exposed by the mask strips 204, 206, 208. Alternatively stated, the portions of the sheet 202 left exposed by the mask strips 204, 206, 208 may be retained on the substrate 200 to act as bottommost monolayers for the two-dimensional metallic contacts 212, 214. In such embodiments, different regions of the sheet 202 may have different electronic character, depending on whether additional layers 216, 218 are formed thereon. For example, the regions of the sheet 202 underlying the mask strips 204, 206, 208 have semiconducting properties, and the regions of the sheet 202 together with the overlying layers 216, 218 will have metallic properties. At the boundary of such regions, semiconductor-metallic junctions 220, 222 are formed, as indicated between the channel region 210 and the two-dimensional metallic contact 212 and between the channel region 210 and the two-dimensional metallic contact 214, respectively. In some embodiments, the semiconductor-metallic junctions 220, 222 have reduced contact resistance because of the horizontal contact geometry between the two-dimensional metallic material and the two-dimensional semiconductor material.

As previously described, during formation of the two-dimensional metallic contacts 212, 214 portions 224, 226, 228 of the thickness-modulated switchable material may be respectively formed on the mask strips 204, 206, 208. In some embodiments, forming the semiconductor device D20 includes performing process steps similar to the ones previously described with reference to FIG. 1F to FIG. 2K. Briefly, referring to FIG. 4A, FIG. 5A, FIG. 4B, and FIG. 5B, the mask strips 204, 206, 208 with the overlying portions 224, 226, 228 of thickness-modulated switchable material are removed, for example via ashing or stripping. Metal contacts 230, 232 are formed on the sheet 202 beside the two-dimensional metallic contacts 212, 214, for example by disposing a metal material in trenches defined by photoresist strips (not shown). The sheet 202 may be trimmed at the sides to remove portions not covered by the metal contacts 230, 232, thus forming the strip 234 of thickness-modulated switchable material extending from the metal contact 230 on one side of the channel region 210 to the metal contact 232 at the opposite side of the channel region 210. The gate structure 236 including the gate dielectric layer 238 and the gate metal layer 240 is then formed on the channel region 210, in between the two-dimensional metallic contacts 212, 214.

In some embodiments, the metal contacts 230, 232 contact the outer sidewalls 212o, 214o of the two-dimensional metallic contacts 212, 214, respectively, thus forming lateral (horizontal) metallic-metal junctions 242, 244. In some embodiments, the lateral (horizontal) geometry of the metallic-metal junctions 242, 244 results in reduced contact resistance. Without being bound to or limited by any theory, it is possible the reduced contact resistance stems from a lower or absent van der Waals barrier between the two-dimensional metallic material and the metal. In some embodiments, the metal contacts 230, 232 extend also on the top surfaces 212t, 214t of the two-dimensional metallic contacts 212, 214. In some embodiments, the metal contacts 230, 232 cover at least a portion of the top surfaces 212t, 214t. In some embodiments, the gate dielectric layer 238 extends on the inner sidewalls 212i, 214i of the two-dimensional metallic contacts. In some embodiments, the gate dielectric layer 238 further extends on the portions of the top surfaces 212t, 214t not covered by the metal contacts 230, 232. In some embodiments, the gate dielectric layer 238 separates the gate metal layer 240 from the metal contacts 230, 232 and the two-dimensional metallic contacts 212, 214.

Figure 7:
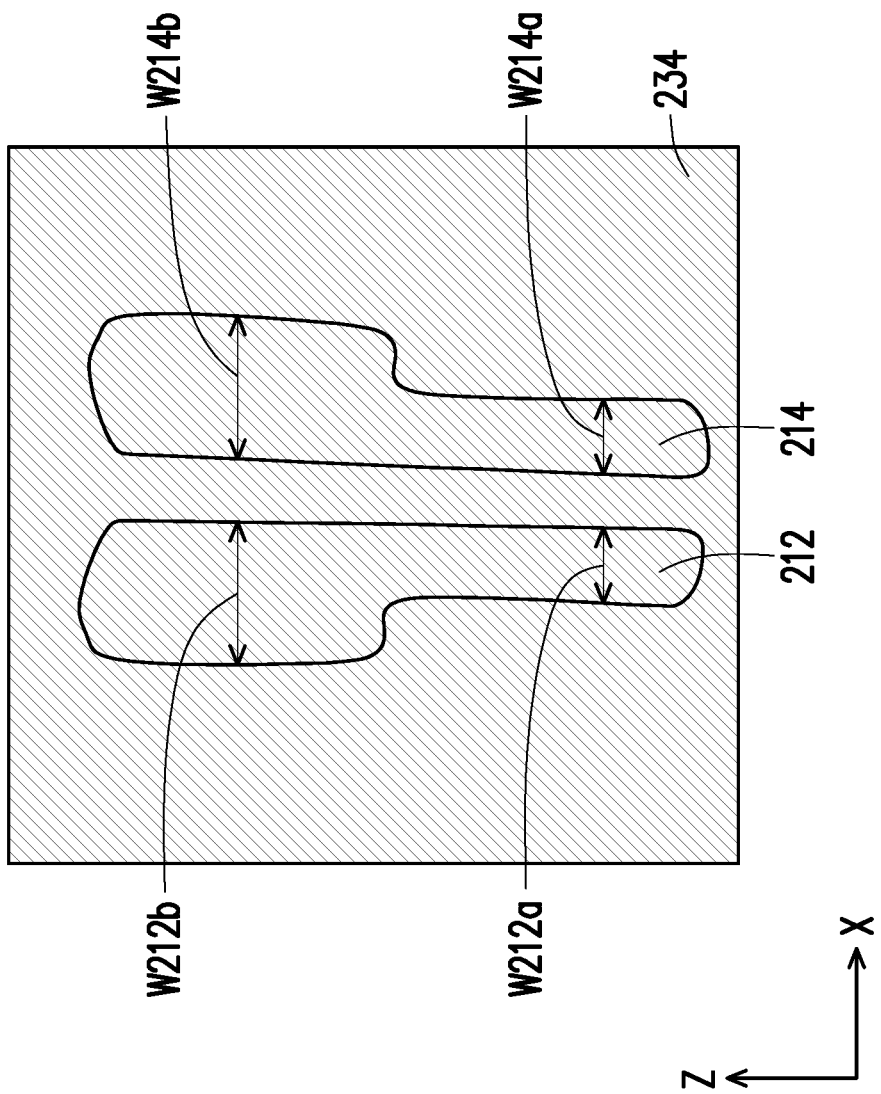
FIG. 7 is a schematic top view of components of a semiconductor device according to some embodiments of the disclosure.

FIG. 7 is a schematic top view of the two-dimensional metallic contacts 212, 214 according to some embodiments of the disclosure. In some embodiments, the two-dimensional metallic contacts 212, 214 may have an elongated shape along the Y direction, with regions of different widths along the X direction. For example, the two-dimensional metallic contacts 212, 214 may present narrower regions of widths W212a, W214a protruding from wider regions of width W212b, W214b. In some embodiments, the shape of the two-dimensional metallic contacts 212, 214 is determined by the pattern of the mask strips 204, 206, 208. In some embodiments, the shape of the two-dimensional metallic contacts 212, 214 is not particularly limited, and may be selected according to circuit design and/or production requirements.

Figure 8A:
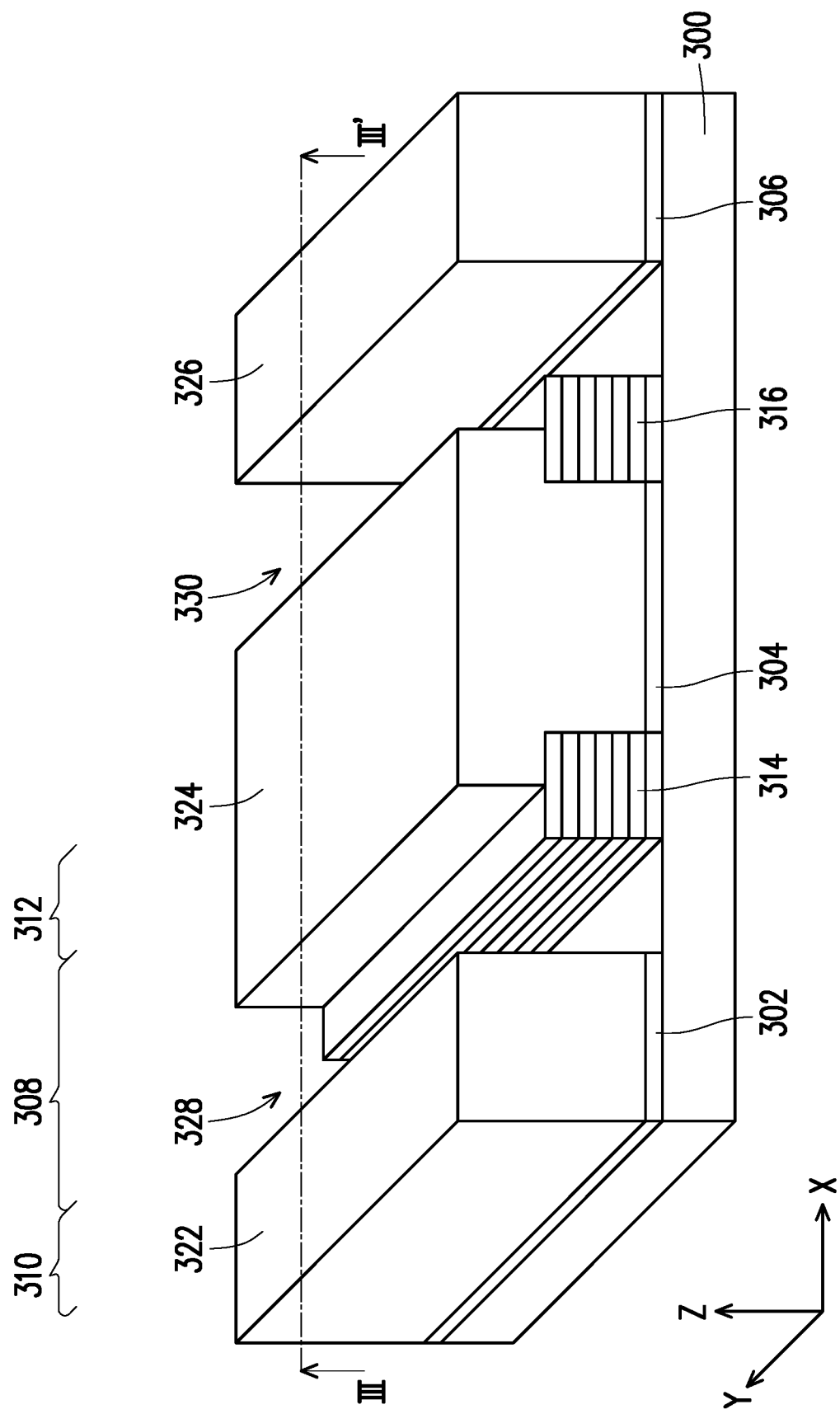
FIG. 8A and FIG. 8B are schematic perspective views of structures formed during a manufacturing process of a semiconductor device according to some embodiments of the disclosure.
Figure 8B:
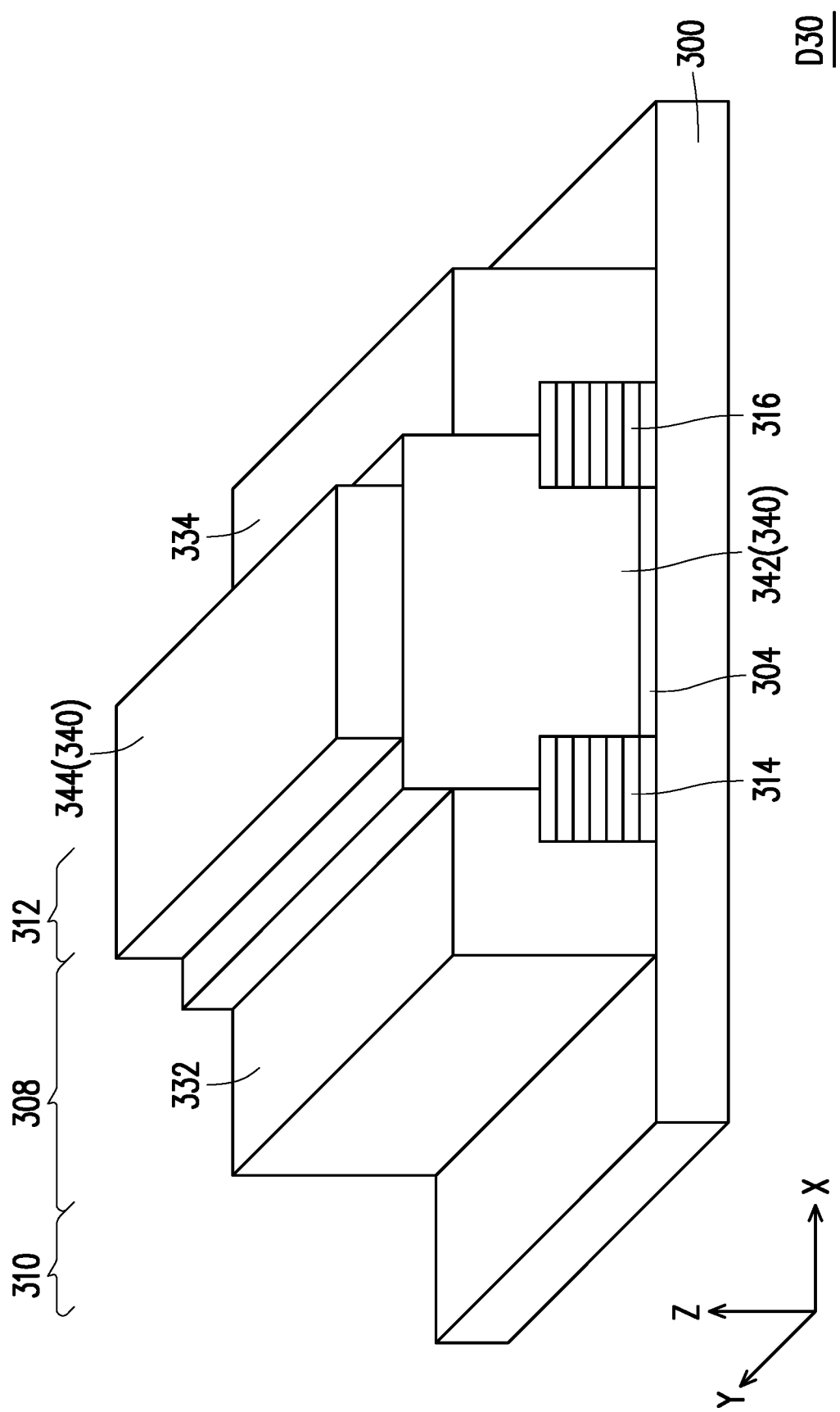
Figure 9A:
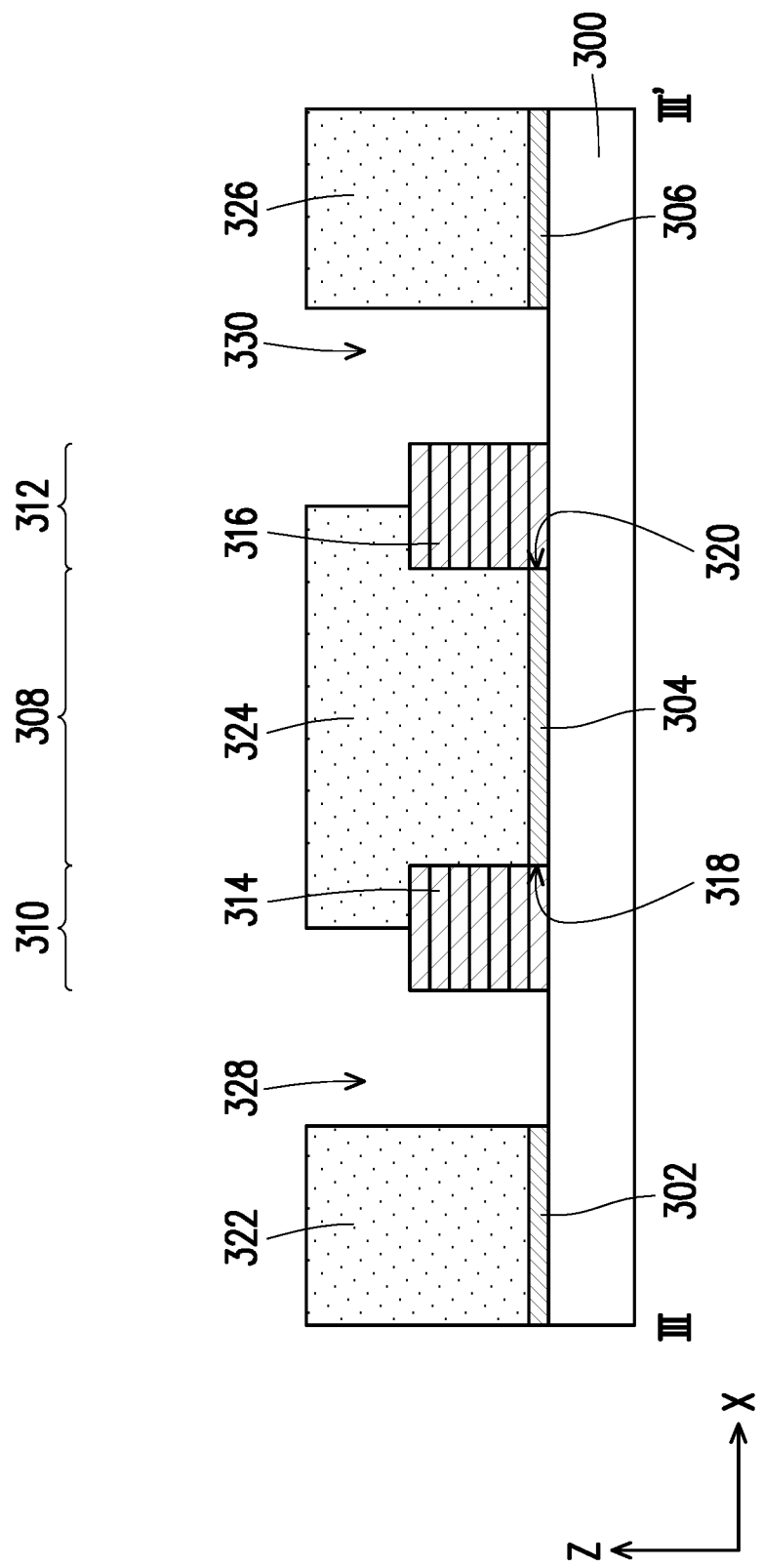
FIG. 9A and FIG. 9B are schematic cross-sectional views of the structures illustrated in FIG. 8A and FIG. 8B, respectively, according to some embodiments of the disclosure.
Figure 9B:
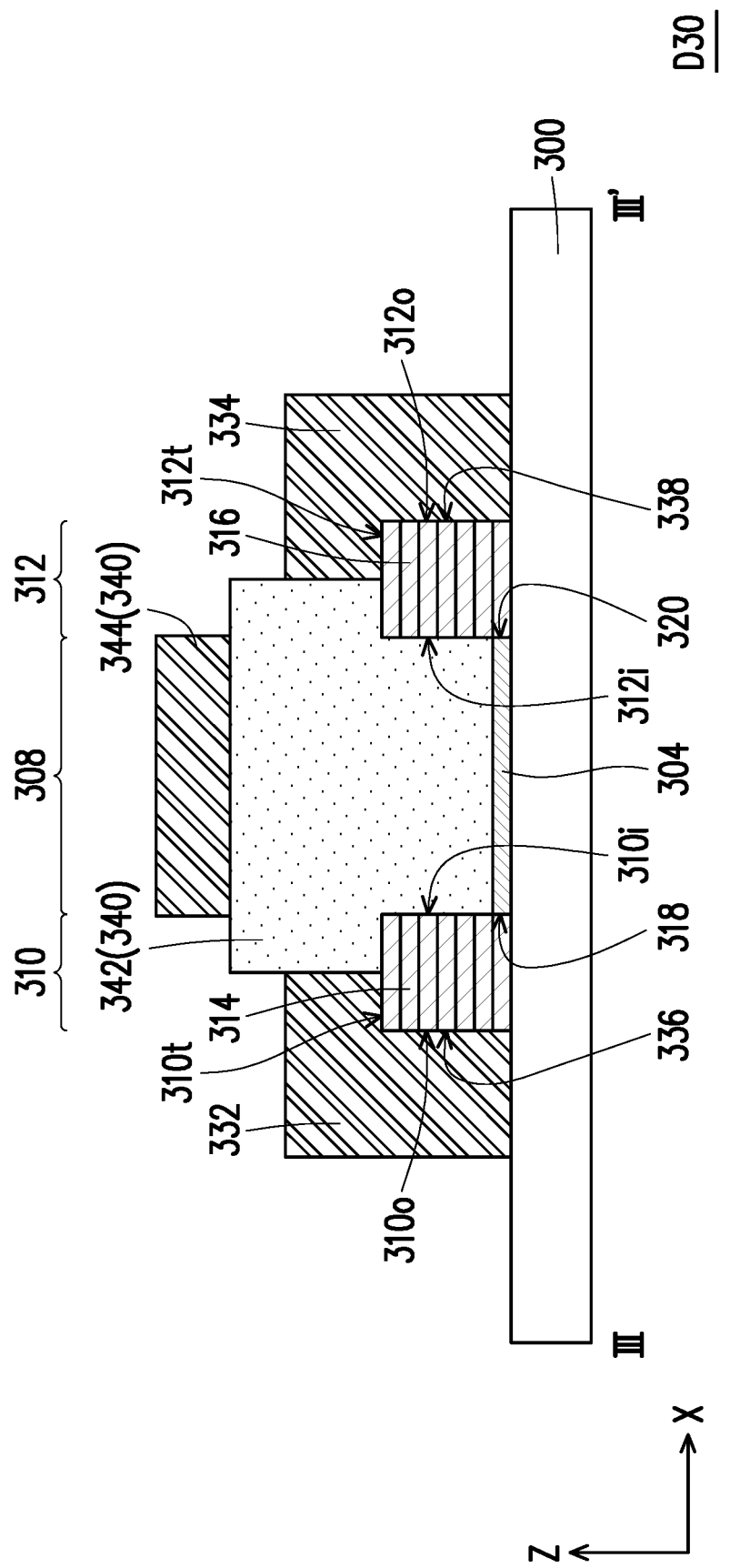

FIG. 8A and FIG. 8B are schematic perspective views of structures formed during a manufacturing process of the semiconductor device D30. FIG. 9A and FIG. 9B are schematic cross-sectional views of the structures of FIG. 8A and FIG. 8B, respectively, taken at the XZ plane at the level height of the line III-III' along the Y direction. In some embodiments, the structure of FIG. 8A and FIG. 9A may be formed following similar processes as previously described with reference to FIG. 1A to FIG. 2G. As previously described, the steps may be performed at the FEOL level or the BEOL level, according to the desired structure. Briefly, on the substrate 300, the strips 302, 304, 306 of two-dimensional semiconductor material are formed by patterning a precursor sheet (not shown) of two-dimensional semiconductor material initially formed on the substrate. The strip 304 of two-dimensional semiconductor material may be configured as a channel region 308, and two-dimensional metallic contacts 310, 312 may be formed at opposite ends of the channel region 308, by providing the layers 314, 316 of two-dimensional metallic material on the substrate 300. The two-dimensional metallic material of the two-dimensional metallic contacts 310, 312 may be different (in terms of chemical composition) from the two-dimensional semiconductor material of the channel region 308, and the layers 314, 316 may be formed directly on the substrate, after removal of the two-dimensional semiconductor material of the precursor sheet. In some embodiments, the two-dimensional metallic contacts 314, 316 forms lateral (horizontal) semiconductor-metallic junctions 318, 320 with the two-dimensional semiconductor material of the channel region 308, thus lowering the contact resistance at the interface between the two materials. As previously described, in some embodiments, the two-dimensional metallic material of one or more monolayers of the layers 314, 316 may be covalently bonded to the two-dimensional semiconductor material of one or more corresponding monolayers of the strip 304 in the channel region 308. In some embodiments, the photoresist strips 322, 324, 326 are formed in a similar manner as previously described with reference to FIG. 1G. In some embodiments, the structure of FIG. 8A may be obtained from the structure of FIG. 1G by removing the two-dimensional semiconductor material from the bottom of the trenches 328, 330 separating the photoresist strips 322, 324, 326, so that the substrate 300 may be exposed at the bottom of the trenches 328, 330.

In some embodiments, forming the semiconductor device D30 includes performing process steps similar to the ones previously described with reference to FIG. 1H to FIG. 2K. Briefly, referring to FIG. 8A, FIG. 8B, FIG. 9A, and FIG. 9B, metal contacts 332, 334 are formed on the substrate 300 beside the two-dimensional metallic contacts 310, 312, for example by disposing a metal material in trenches 328, 330 defined by the photoresist strips 322, 324, 326. The photoresist strips 322, 324, 326 are removed, for example via ashing or stripping. In some embodiments, the strips 302, 306 of two-dimensional semiconductor material exposed after removal of the photoresist strips 322, 324, 326 are removed, so that only the strip 304 of two-dimensional semiconductor material remains in the channel region 308. The metal contacts 332, 334 may be in direct contact with the substrate 300. The metal contacts 332, 334 extend on the outer sidewalls 310o, 312o of the two-dimensional metallic contacts 310, 312, forming lateral (horizontal) metallic-metal junctions 336, 338. The horizontal geometry of the metallic-metal junctions 336, 338 may result in lower contact resistance. The gate structure 340 including the gate dielectric layer 342 and the gate metal layer 344 is then formed on the channel region 308, in between the two-dimensional metallic contacts 310, 312. In some embodiments, the metal contacts 332, 334 extend also on the top surfaces 310t, 312t of the two-dimensional metallic contacts 310, 312. In some embodiments, the metal contacts 332, 334 cover at least a portion of the top surfaces 310t, 312t. In some embodiments, the gate dielectric layer 342 extends on the inner sidewalls 310i, 312i of the two-dimensional metallic contacts 310, 312. In some embodiments, the gate dielectric layer 342 further extends on the portions of the top surfaces 310t, 312t not covered by the metal contacts 332, 334. In some embodiments, the gate dielectric layer 342 separates the gate metal layer 344 from the metal contacts 332, 334 and the two-dimensional metallic contacts 310, 312.

Figure 10A:
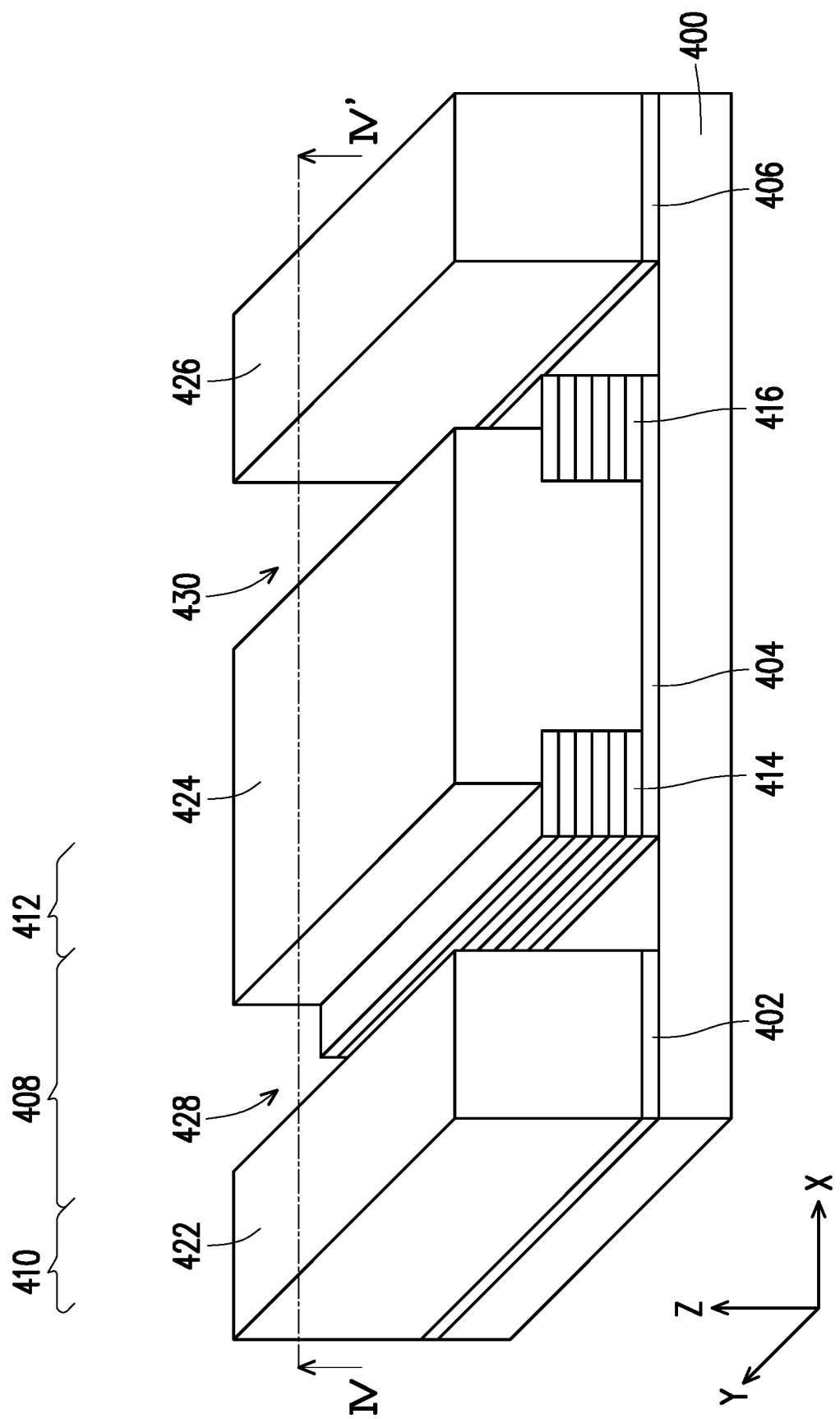
FIG. 10A and FIG. 10B are schematic perspective views of structures formed during a manufacturing process of a semiconductor device according to some embodiments of the disclosure.
Figure 10B:
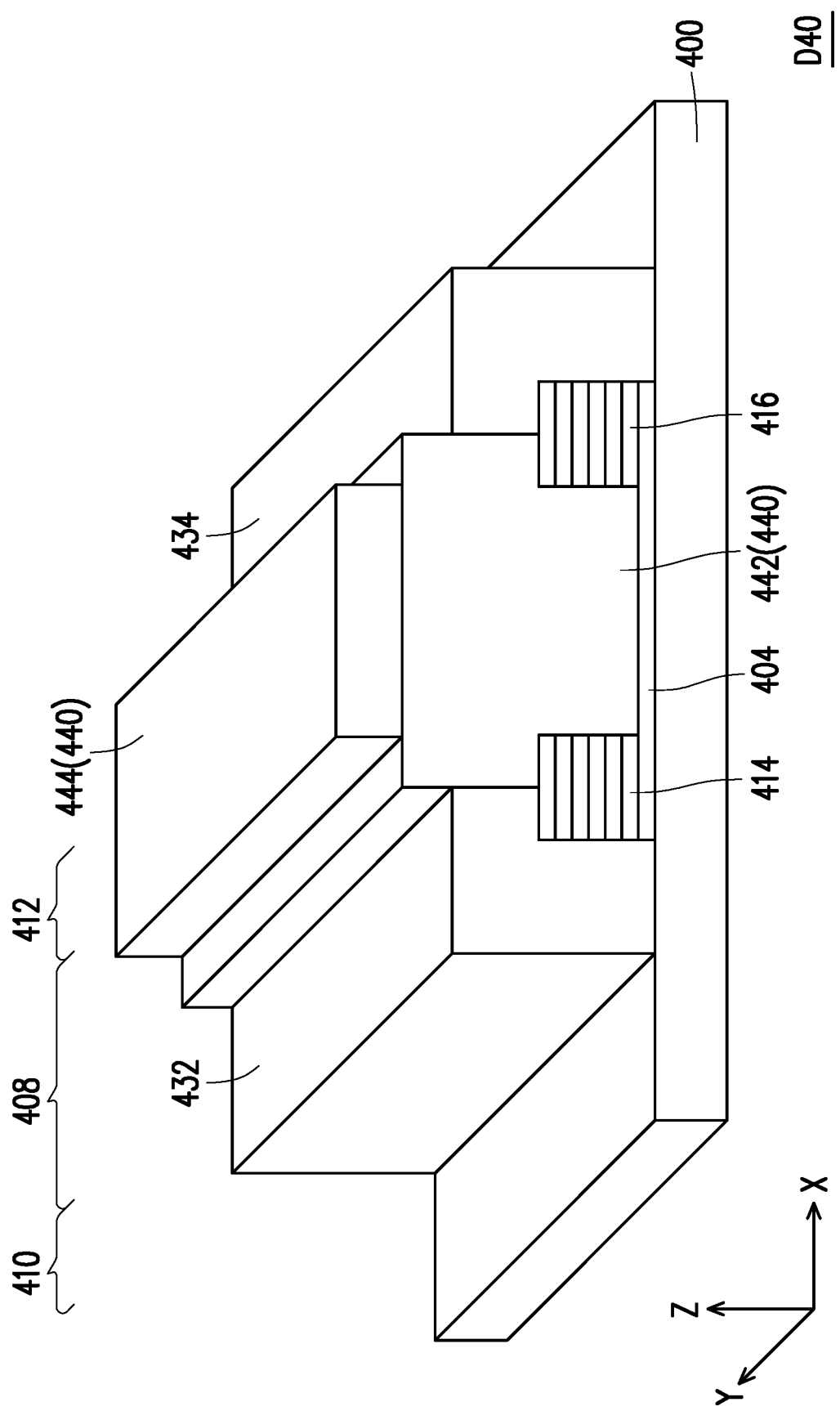
Figure 11A:
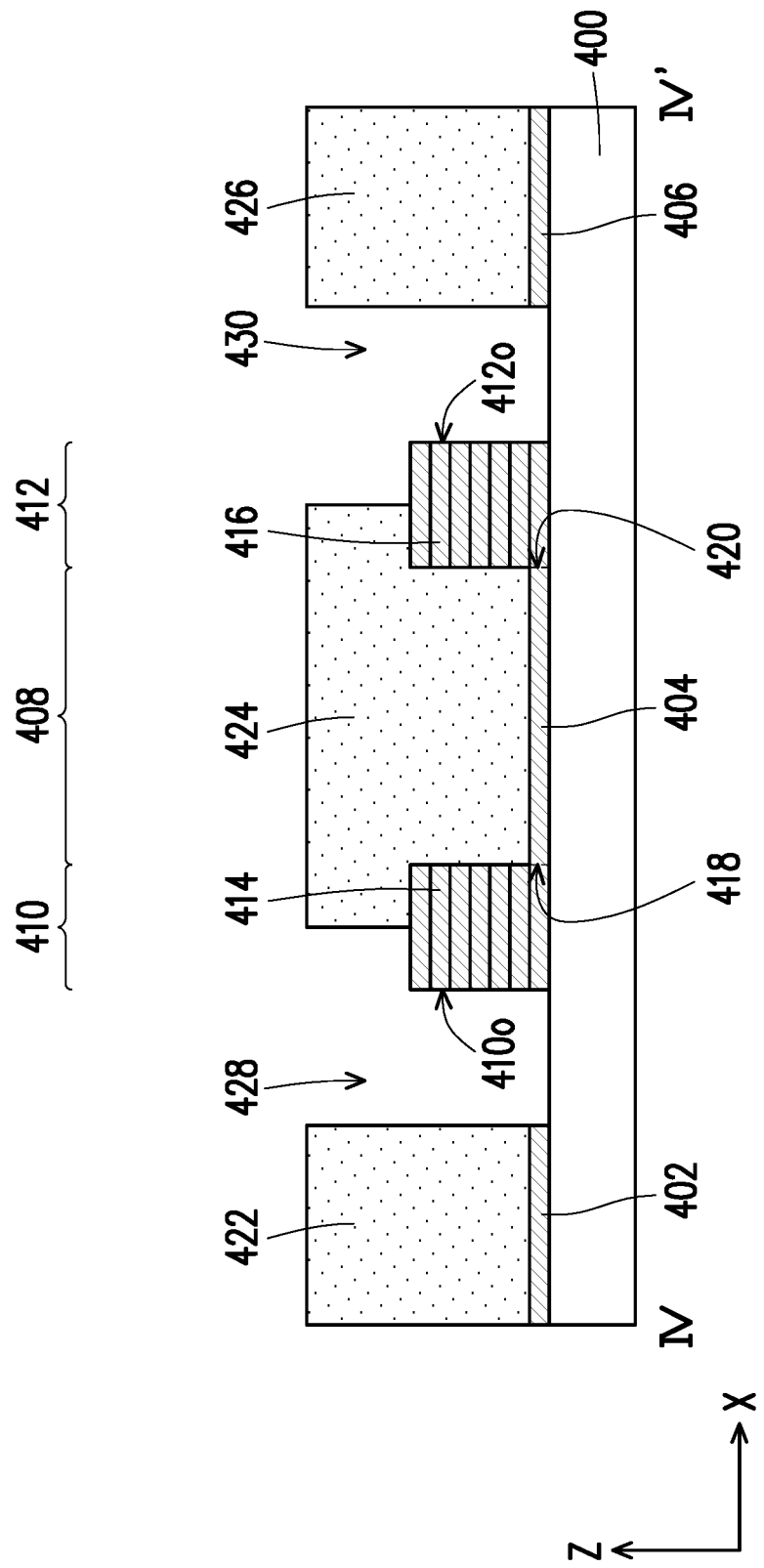
FIG. 11A and FIG. 11B are schematic cross-sectional views of the structures illustrated in FIG. 10A and FIG. 10B, respectively, according to some embodiments of the disclosure.
Figure 11B:
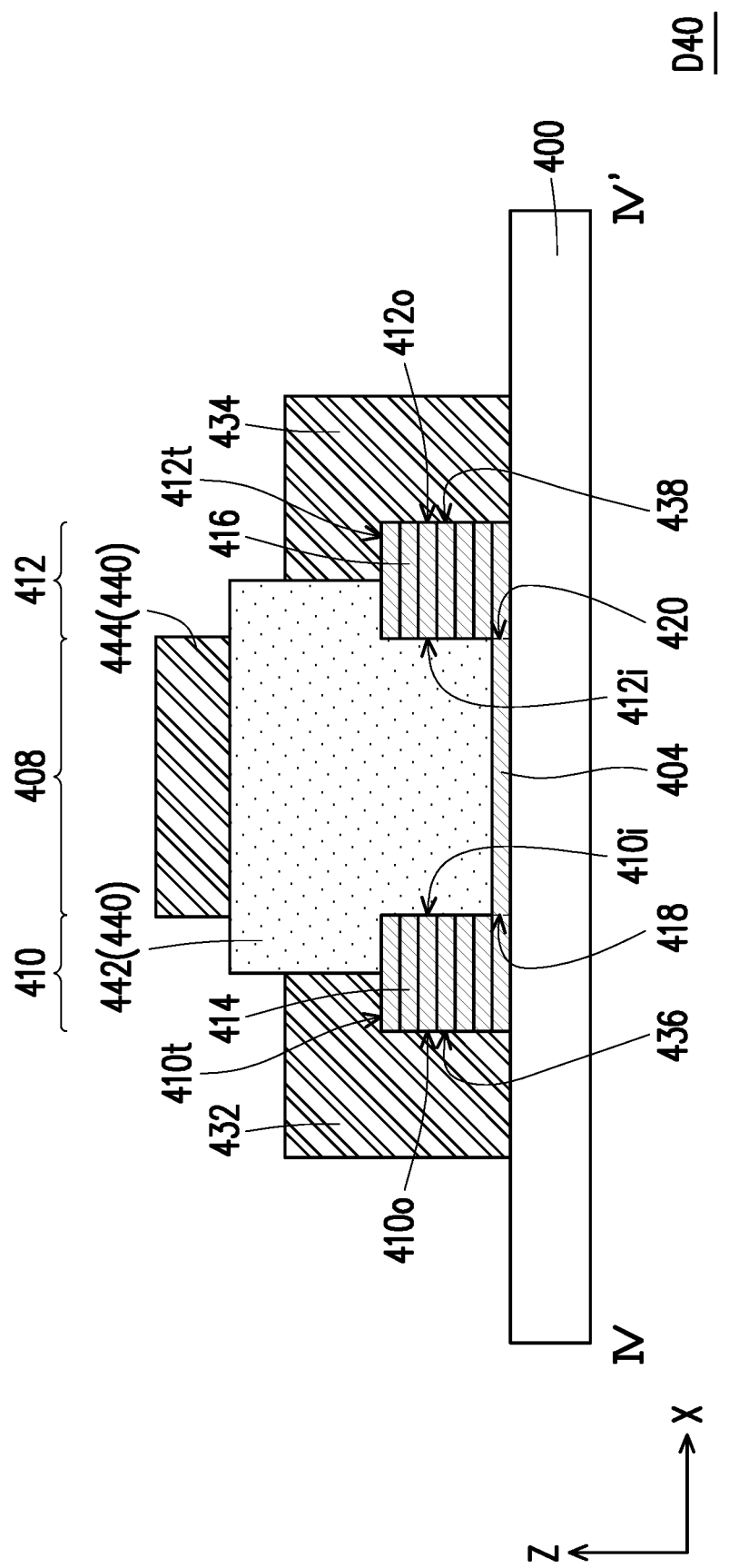

FIG. 10A and FIG. 10B are schematic perspective views of structures formed during a manufacturing process of the semiconductor device D40. FIG. 11A and FIG. 11B are schematic cross-sectional views of the structures of FIG. 10A and FIG. 10B, respectively, taken at the XZ plane at the level height of the line IV-IV' along the Y direction. In some embodiments, the structure of FIG. 10A and FIG. 11A may be formed from the structure of FIG. 5A following similar processes as previously described. In some embodiments, the steps may be performed at the FEOL level or the BEOL level, according to the desired structure. Briefly, on the substrate 400, the strips 402, 404, 406 of two-dimensional semiconductor material are formed by removing portions of a precursor sheet (not shown) of two-dimensional semiconductor material initially formed on the substrate. In some embodiments, the strips 402, 404, 406 include a thickness-modulated switchable material, similar to what was previously discussed with reference to FIG. 4A and FIG. 5A. The strip 404 of two-dimensional semiconductor material may be configured as a channel region 408, and two-dimensional metallic contacts 410, 412 may be formed at opposite ends of the channel region 408, by providing the additional layers 414, 416 of the thickness-modulated switchable material on the strip 404. That is, the metallic character of the two-dimensional metallic contacts 410, 412 may be achieved by stacking a sufficient number of monolayers as the layers 414, 416 on the strip 404, where the layers 414, 416 and the strip 404 include the same thickness-modulated switchable material. In some embodiments, the two-dimensional metallic contacts 410, 412 form lateral (horizontal) semiconductor-metallic junctions 418, 420 with the portion of the strip 404 in the channel region 408, thus lowering the contact resistance between the regions of different electronic character. As previously described, in some embodiments, the strip 404 may extend from the outer sidewall 410*o* of the two-dimensional metallic contact 410 to the outer sidewall 412*o* of the two-dimensional metallic contact 412. In some embodiments, the photoresist strips 422, 424, 426 are formed in a similar manner as previously described with reference to FIG. 1G. In some embodiments, the thickness-modulated switchable material is removed from the bottom of the trenches 428, 430 separating the photoresist strips 422, 424, 426, so that the substrate 400 is exposed at the bottom of the trenches 428, 430.

In some embodiments, forming the semiconductor device D40 includes performing process steps similar to the ones previously described with reference to FIG. 1H to FIG. 2K. Briefly, referring to FIG. 10A, FIG. 10B, FIG. 11A, and FIG. 11B, metal contacts 432, 434 are formed on the substrate 400 beside the two-dimensional metallic contacts 410, 412, for example by disposing a metal material in the trenches 428, 430 defined by the photoresist strips 422, 424, 426. The photoresist strips 422, 424, 426 are removed, for example via ashing or stripping. In some embodiments, the strips 402, 406 of two-dimensional semiconductor material exposed after removal of the photoresist strips 422, 424, 426 are also removed, so that only the strip 404 of two-dimensional semiconductor material remains on the substrate 400. The metal contacts 432, 434 may be in direct contact with the substrate 400. The metal contacts 432, 434 extend on the outer sidewalls 410*o*, 412*o* of the two-dimensional metallic contacts 410, 412, forming lateral (horizontal) metallic-metal junctions 436, 438. The horizontal geometry of the metallic-metal junctions 436, 438 may result in lower contact resistance. The gate structure 440 including the gate dielectric layer 442 and the gate metal layer 444 is then formed on the channel region 408, in between the two-dimensional metallic contacts 410, 412. In some embodiments, the metal contacts 432, 434 may further extend on the top surfaces 410*t*, 412*t* of the two-dimensional metallic contacts 410, 412. In some embodiments, the metal contacts 410, 412 cover at least a portion of the top surfaces 410*t*, 412*t*. In some embodiments, the gate dielectric layer 442 extends on the inner sidewalls 410*i*, 412*i* of the two-dimensional metallic contacts 410, 412. In some embodiments, the gate dielectric layer 442 further extends on the portions of the top surfaces 410*t*, 412*t* not covered by the metal contacts 432, 434. In some embodiments, the gate dielectric layer 442 separates the gate metal layer 444 from the metal contacts 432, 434 and the two-dimensional metallic contacts 410, 412.

Figure 12A:
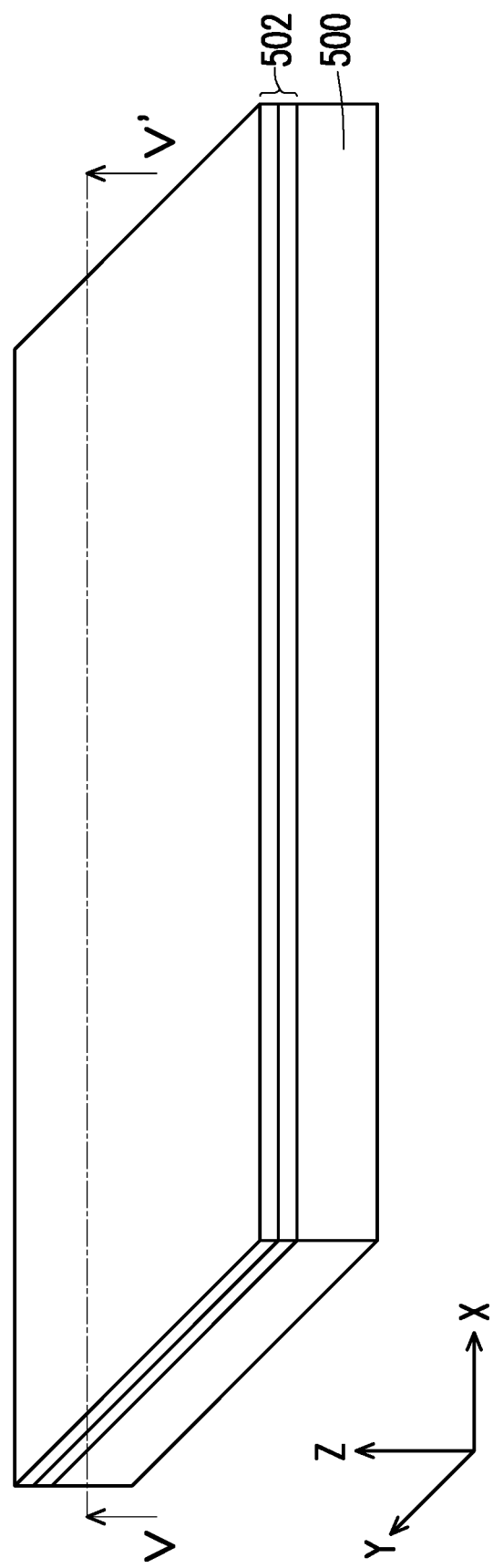
FIG. 12A and FIG. 12B are schematic perspective views of structures formed during a manufacturing process of a semiconductor device according to some embodiments of the disclosure.
Figure 12B:
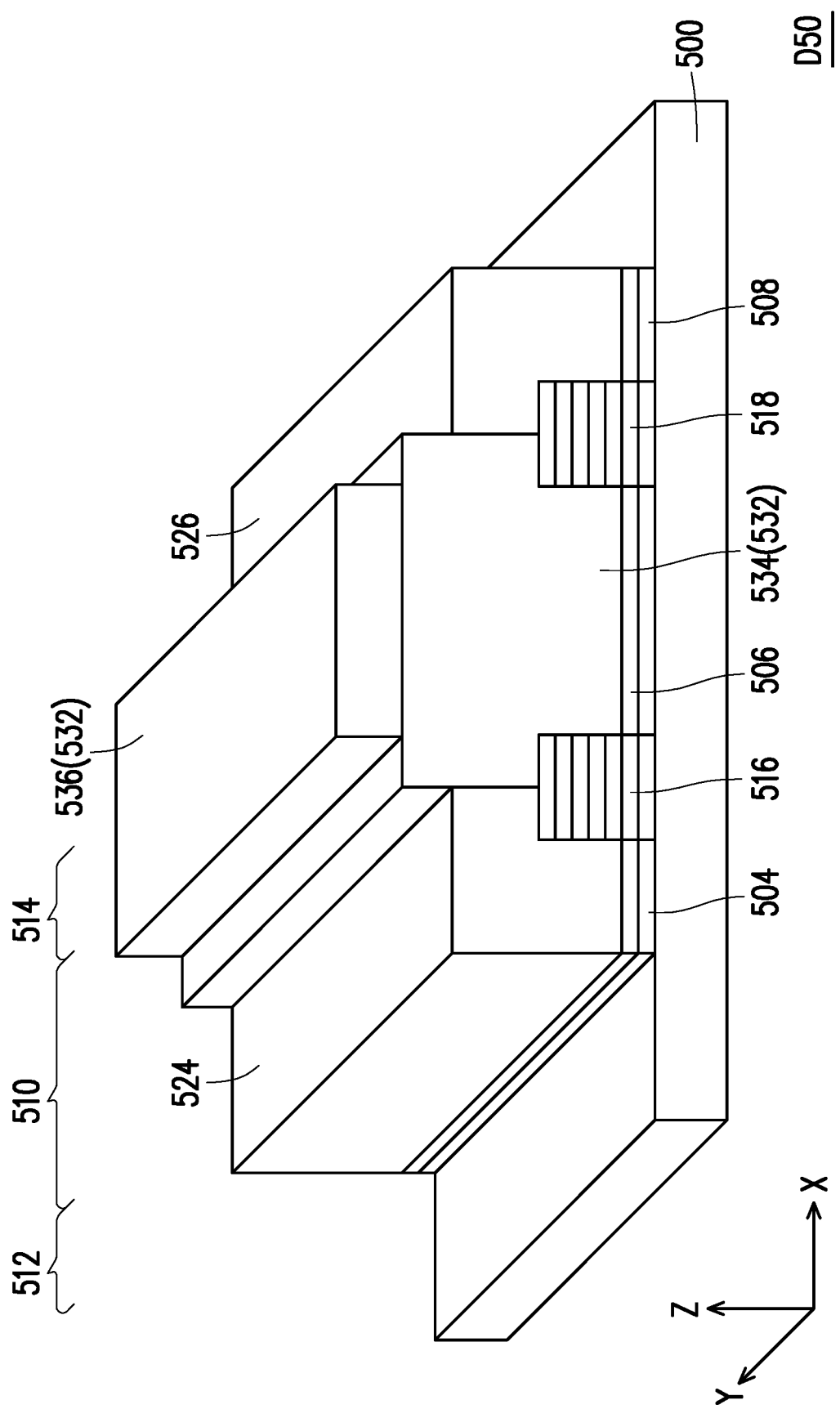
Figure 13A:
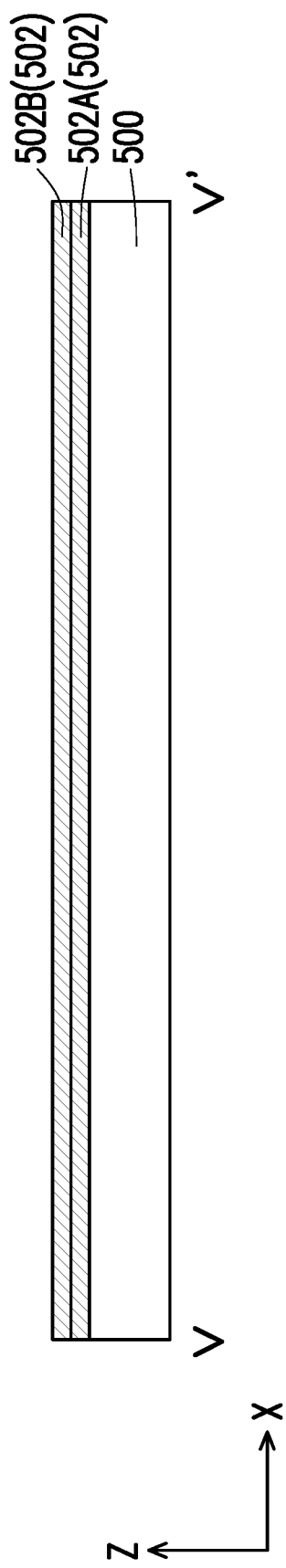
FIG. 13A and FIG. 13B are schematic cross-sectional views of the structures illustrated in FIG. 12A and FIG. 12B, respectively, according to some embodiments of the disclosure.
Figure 13B:
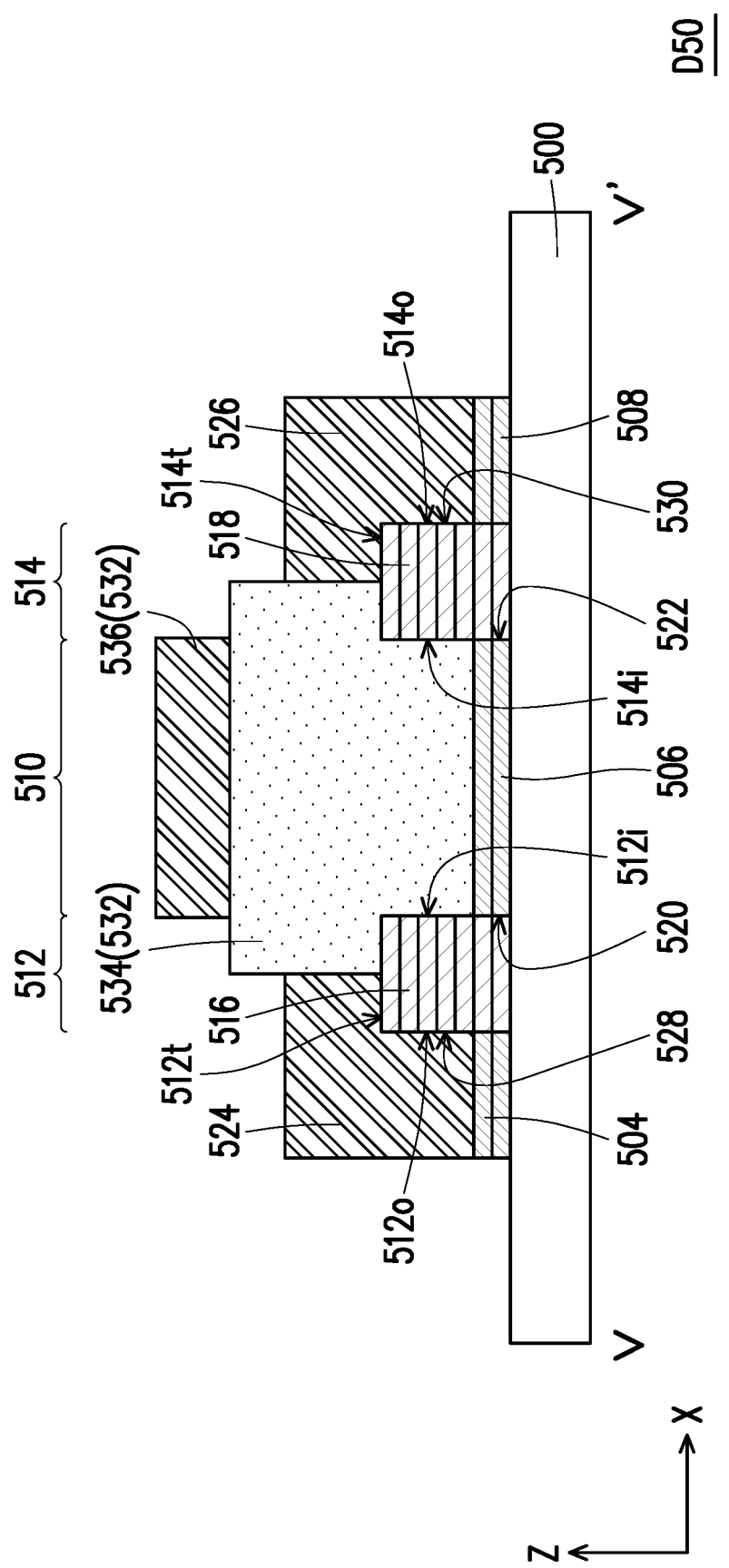
Figure 14:
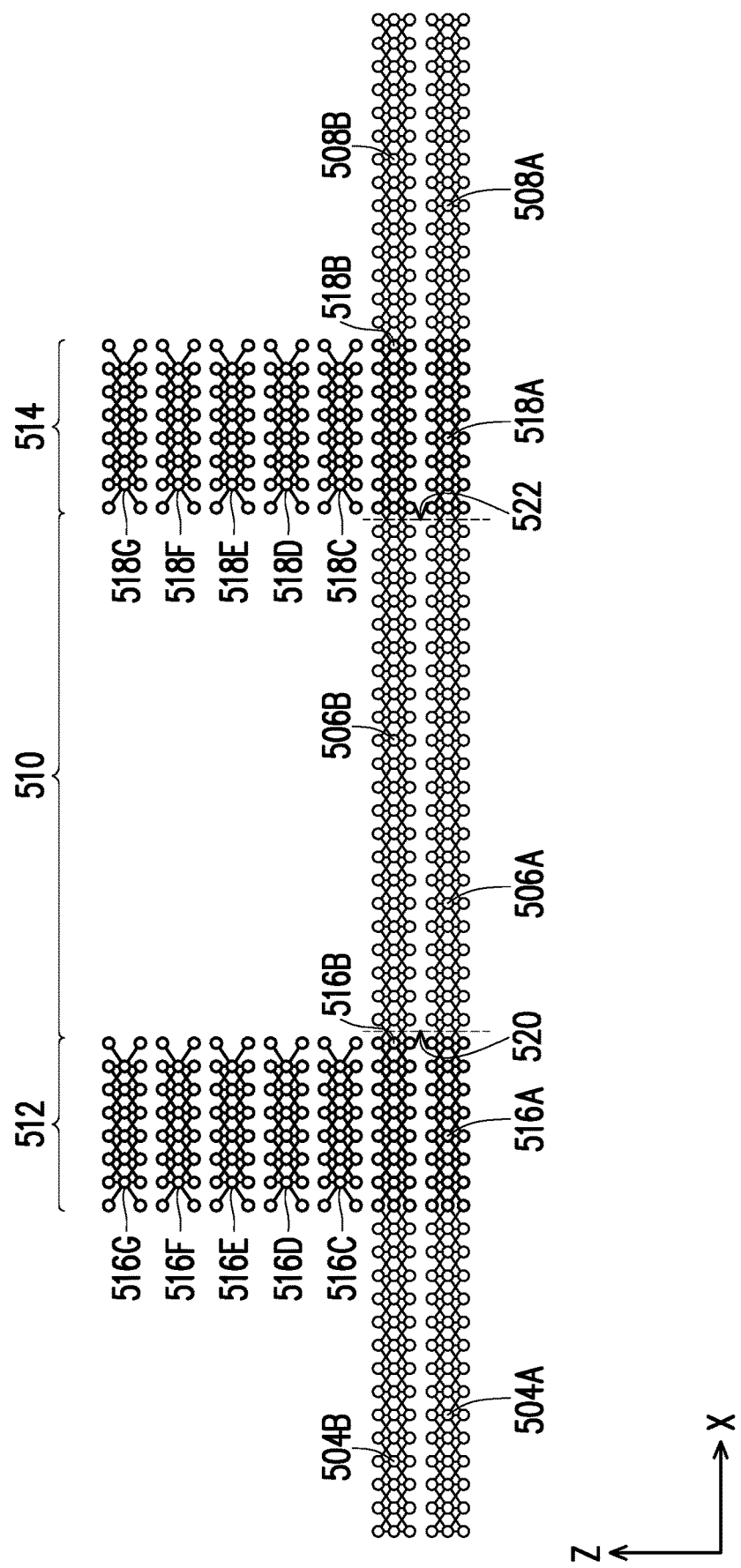
FIG. 14 is a schematic representation of components of a semiconductor device according to some embodiments of the disclosure.

FIG. 12A and FIG. 12B are schematic perspective views of structures formed during manufacturing of the semiconductor device D50 according to some embodiments of the disclosure. FIG. 13A and FIG. 13B are schematic cross-sectional views of the structures illustrated in FIG. 12A and FIG. 12B, taken in the XZ plane located at the level height of the line V-V' along the Y direction. FIG. 14 is a schematic view of some components of the semiconductor device D50 according to some embodiments of the disclosure. Referring to FIG. 12A and FIG. 13A, in some embodiments, a substrate 500 is provided. The substrate 500 may be similar to the substrate 100 of FIG. 1A. In some embodiments, the sheet 502 of two-dimensional semiconductor material is formed on the substrate 500. In some embodiments, a difference with respect to the structure illustrated in FIG. 1A lies in that the sheet 502 of two-dimensional semiconductor material includes multiple stacked monolayers (e.g., the two monolayers 502A, 502B) of two-dimensional semiconductor material. Referring to FIG. 12A to FIG. 14, in some embodiments, manufacturing the semiconductor device D50 includes performing process steps as previously described, for example with reference to FIG. 1B to FIG. 2K. Briefly, the sheet 502 of two-dimensional semiconductor material is patterned to form strips 504, 506, 508 of two-dimensional semiconductor material. The strip 506 may correspond to the channel region 510, and two-dimensional metallic contacts 512, 514 may be formed on the substrate 500 at opposite sides of the strip 506, for example by forming the layers 516, 518 of two-dimensional metallic material. In some embodiments, the two-dimensional metallic contacts 512, 514 include a different material than the strip 506 of two-dimensional semiconductor material. In some alternative embodiments, the two-dimensional metallic contacts 512, 514 and the strip 506 of two-dimensional semiconductor material may include a different number of monolayers 506A, 506B, 516A-G, 518A-G of a same thickness-modulated switchable material. In some embodiments, lateral semiconductor-metallic junctions 520, 522 are formed at the boundary between the channel region 510 and the two-dimensional metallic contacts 512, 514. In some embodiments, the monolayers 506A, 508B, 516A-G, 518A-G of two-dimensional materials of the channel region 510 and the two-dimensional metallic contacts 512, 514 may include transition metal dichalcogenides. Within a monolayer 506A, 506B, 516A-G, or 518A-G, transition metal atoms are disposed between two levels of chalcogen atoms to which the transition metal is (covalently) bonded, and, upon stacking, chalcogen atoms belonging to different monolayers are separated from each other by a van der Waals gap. In some embodiments, monolayers 516A, 516B, 518A, 518B of the two-dimensional metallic contacts 512, 514 may be (covalently) bonded to corresponding monolayers 506A, 506B of two-dimensional semiconductor material in the channel region 510. For example, when the strip 506 of two-dimensional semiconductor material includes two monolayers 506A, 506B stacked over each other, the bottommost monolayer 506A may be bonded to the bottommost monolayer 516A of the two-dimensional metallic contact 512 and the bottommost monolayer 518A of the two-dimensional metallic contact 514, and the upper monolayer 506B may be bonded to the corresponding monolayers 516B and 518B of the two-dimensional metallic contacts 512, 514. The remaining monolayers 516C-G, 518C-G may be stacked on the upper monolayers 516B, 518B, respectively. In some embodiments, corresponding bonds may exist between the monolayers 516A, 516B and the monolayers 504A, 504B of the strip 504, and between the monolayers 518A, 518B and the monolayers 508A, 508B of the strip 508. The disclosure does not limit the number of monolayers 506A, 506B, 516A-G, 518A-G as long as the strip 506 in the channel region 510 has semiconductor character, and the two-dimensional metallic contacts 512, 514 have metallic character.

Referring to FIG. 12B and FIG. 13B, metal contacts 524, 526 are respectively formed on the strips 504, 508 beside the two-dimensional metallic contacts 512, 514, for example by disposing a metal material in trenches defined by photoresist strips (not shown). In some embodiments, the strips 504, 508 of two-dimensional semiconductor material are trimmed by removing portions of the strips 504, 508 not covered by the metal contacts 524, 526, so as to expose the substrate 500. In some embodiments, the metal contacts 524, 526 extend on the outer sidewalls 512o, 514o of the two-dimensional metallic contacts 512, 514, forming lateral (horizontal) metallic-metal junctions 528, 530. The horizontal geometry of the metallic-metal junctions 528, 530 may result in lower contact resistance. In some embodiments, the gate structure 532 including the gate dielectric layer 534 and the gate metal layer 536 is then formed on the channel region 510, in between the two-dimensional metallic contacts 512, 514. In some embodiments, the metal contacts 524, 526 may further extend on the top surfaces 512t, 514t of the two-dimensional metallic contacts 512, 514. In some embodiments, the metal contacts 524, 526 cover at least a portion of the top surfaces 512t, 514t. In some embodiments, the gate dielectric layer 534 extends on the inner sidewalls 512i, 514i of the two-dimensional metallic contacts 512, 514. In some embodiments, the gate dielectric layer 534 further extends on the portions of the top surfaces 512t, 514t not covered by the metal contacts 524, 526. In some embodiments, the gate dielectric layer 534 separates the gate metal layer 536 from the metal contacts 524, 526 and the two-dimensional metallic contacts 512, 514.

While some embodiments have been discussed above for illustration purpose, the disclosure is not limited thereto, and features of different embodiments may be combined as required. For example, any one of the strips 118 of FIG. 1K, 234 of FIG. 4B, 304 of FIG. 8B, or 404 of FIG. 10B may include multiple monolayers of two-dimensional semiconductor material, as described for the strip 506 of FIG. 12B. As another example, the metal contacts 524, 526 of FIG. 12B may be formed directly on the substrate 500, omitting the strips 504 and 508.

For all the disclosed embodiments, additional process steps and features may also be included. For example, when the described manufacturing process is performed as a front-end-of-line process, active or passive devices (not shown) may be formed on the substrate (e.g., the substrate 100) in addition to the described steps, and an interconnection structure (not shown) may integrate such devices into a functional circuit. In some embodiments, an interlayer dielectric (not shown) may be formed on the substrate burying the fabricated transistors, and contact vias (not shown) may be formed through the interlayer dielectric to land on the metal contacts (e.g., the metal contacts 152, 154 of FIG. 1K) or the gate metal layer (e.g., the gate metal layer 168 of FIG. 1K), to integrate the transistor in larger circuits.

In accordance with some embodiments of the disclosure, a semiconductor device includes a channel region, a first two-dimensional metallic contact, a second two-dimensional metallic contact, a gate structure, a first metal contact, and a second metal contact. The channel region includes a two-dimensional semiconductor material. The first two-dimensional metallic contact is disposed at a side of the channel region and includes a two-dimensional metallic material. The second two-dimensional metallic contact is disposed at an opposite side of the channel region and includes the two-dimensional metallic material. The gate structure is disposed on the channel region in between the first two-dimensional metallic contact and the second two-dimensional metallic contact. The first metal contact is disposed at an opposite side of the first two-dimensional metallic contact with respect to the channel region. The second metal contact is disposed at an opposite side of the second two-dimensional metallic contact with respect to the channel region. The first two-dimensional metallic contact and the second two-dimensional metallic contact contact sideways the channel region to form lateral semiconductor-metallic junctions.

In accordance with some embodiments of the disclosure, a semiconductor device comprises a substrate, a strip of a two-dimensional semiconductor material, layers of a two-dimensional metallic material, metal blocks and a gate structure. The strip of the two-dimensional semiconductor material is disposed on the substrate. The layers of the two-dimensional metallic material are disposed over the substrate in stacks at opposite sides of the strip. The metal blocks extend on outer sidewalls of the stacked layers of the two-dimensional metallic material. The gate structure is disposed on the strip of the two-dimensional semiconductor material in between the stacks of the layers of the two-dimensional metallic material. The strip of two-dimensional semiconductor material extends on the substrate along a first direction and a second direction perpendicular to the first direction. Semiconductor-metallic junctions between the layers of the two-dimensional metallic material and the strip of the two-dimensional semiconductor material extend along at least one direction selected from the first direction and the second direction and along a third direction perpendicular to the first direction and the second direction.

In accordance with some embodiments of the disclosure, a manufacturing method of a semiconductor device includes the following steps. A sheet of a two-dimensional semiconductor material is formed on a substrate. Stacked layers of a two-dimensional metallic material are formed at opposite sides of the two-dimensional semiconductor material. A thickness of the stacked layers of two-dimensional metallic material is greater than a thickness of the sheet of the two-dimensional semiconductor material. Semiconductor-metallic junctions extend parallel to inner sidewalls of the stacked layers of two-dimensional metallic material. The sheet of the two-dimensional semiconductor material is patterned to form a strip of two-dimensional semiconductor material. A metal material is disposed over the substrate. The metal material extends on outer sidewalls of the stacked layers of two-dimensional metallic material. The outer sidewalls are opposite to the inner sidewalls. A gate structure is formed on the strip of the two-dimensional semiconductor material. The gate structure contacts the inner sidewalls of the stacked layers of two-dimensional metallic material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
a channel region disposed on the substrate and comprising a two-dimensional semiconductor material;
a first two-dimensional metallic contact disposed over the substrate, at a side of the channel region and comprising a two-dimensional metallic material;
a second two-dimensional metallic contact disposed on the substrate, at an opposite side of the channel region and comprising the two-dimensional metallic material;
a gate structure, disposed on the channel region in between the first two-dimensional metallic contact and the second two-dimensional metallic contact;
a first metal contact disposed at an opposite side of the first two-dimensional metallic contact with respect to the channel region;
a second metal contact disposed at an opposite side of the second two-dimensional metallic contact with respect to the channel region;
a first layer disposed between the first metal contact and the substrate and comprising the two-dimensional semiconductor material, wherein the first two-dimensional metallic contact is disposed between the first layer and the channel region; and
a second layer disposed between the second metal contact and the substrate and comprising the two-dimensional semiconductor material, wherein the second two-dimensional metallic contact is disposed between the second layer and the channel region,
wherein the first two-dimensional metallic contact and the second two-dimensional metallic contact laterally contact the channel region to form lateral semiconductor-metallic junctions.

2. The semiconductor device of claim 1, wherein the first two-dimensional metallic contact comprises vertically stacked monolayers of the two-dimensional metallic material, and a number of monolayers of the two-dimensional metallic material in the first two-dimensional metallic contact is greater than a number of monolayers of two-dimensional semiconductor material in the channel region.

3. The semiconductor device of claim 2, wherein a bottommost monolayer of the monolayers of the two-dimensional semiconductor material and a bottommost monolayer of the monolayers of the two-dimensional metallic material are horizontally aligned.

4. The semiconductor device of claim 2, wherein the channel region includes a single monolayer of the two-dimensional semiconductor material.

5. The semiconductor device of claim 2, wherein the two-dimensional semiconductor material and the two-dimensional metallic material have a same chemical composition, and a thickness-modulated switchable material is used as the two-dimensional semiconductor material and as the two-dimensional metallic material.

6. The semiconductor device of claim 5, wherein the thickness-modulated switchable material includes at least one selected from $PtSe_2$, $PdSe_2$, and $PtTe_2$.

7. The semiconductor device of claim 2, wherein the number of the monolayers of the two-dimensional metallic material in the first two-dimensional metallic contact is greater than a number of monolayers of the two-dimensional semiconductor material in the first layer.

8. The semiconductor device of claim 1, wherein the first metal contact laterally contacts the first two-dimensional metallic contact to form a lateral metal-metallic junction, and the second metal contact laterally contacts the second two-dimensional metallic contact to form another lateral metal-metallic junction.

9. A semiconductor device, comprising:
a substrate;
a strip of a two-dimensional semiconductor material disposed on the substrate;
layers of a two-dimensional metallic material disposed over the substrate in stacks at opposite sides of the strip;
metal blocks, extending on outer sidewalls of the stacks of the layers of the two-dimensional metallic material;
a gate structure, disposed on the strip of the two-dimensional semiconductor material in between the stacks of the layers of the two-dimensional metallic material; and
additional strips of the two-dimensional semiconductor material disposed between the metal blocks and the substrate,
wherein the layers of the two-dimensional metallic material are interposed between the additional strips of the two-dimensional semiconductor material having the metal blocks disposed thereon and the strip of the two-dimensional semiconductor material having the gate structure disposed thereon, and
wherein the strip of two-dimensional semiconductor material extends on the substrate along a first direction and a second direction perpendicular to the first direction, and semiconductor-metallic junctions between the layers of the two-dimensional metallic material and the strip of the two-dimensional semiconductor material extend along at least one direction selected from the first direction and the second direction and along a third direction perpendicular to the first direction and the second direction.

10. The semiconductor device of claim 9, wherein the two-dimensional semiconductor material and the two-dimensional metallic material have different chemical compositions.

11. The semiconductor device of claim 10, wherein the layers of the two-dimensional metallic material are disposed directly on the substrate.

12. The semiconductor device of claim 9, wherein the layers of the two-dimensional metallic material are disposed on the strip of the two-dimensional semiconductor material.

13. The semiconductor device of claim 9, wherein the metal contacts are in contact with the additional strips of the two-dimensional semiconductor material.

14. The semiconductor device of claim 9, wherein inner sidewalls of the layers of the two-dimensional metallic material extend along the same directions as the semiconductor-metallic junctions.

15. The semiconductor device of claim 9, wherein the metal blocks further extend on top surfaces of the stacks of the layers of the two-dimensional metallic material.

16. The semiconductor device of claim 9, wherein a thickness of the stacks of the layers of two-dimensional metallic material is greater than a thickness of the strip of two-dimensional semiconductor material.

17. A manufacturing method of a semiconductor device, comprising:
- forming a sheet of a two-dimensional semiconductor material on a substrate;
- forming stacked layers of two-dimensional metallic material at opposite sides of the two-dimensional semiconductor material by forming mask strips separated by trenches on the sheet of the two-dimensional semiconductor material, and growing the stacked layers of two-dimensional metallic material in the trenches, wherein a thickness of the stacked layers of two-dimensional metallic material is greater than a thickness of the sheet of two-dimensional semiconductor material, and semiconductor-metallic junctions extend parallel to inner sidewalls of the stacked layers of two-dimensional metallic material;
- patterning the sheet of the two-dimensional semiconductor material to form a strip of the two-dimensional semiconductor material;
- disposing a metal material over the substrate, wherein the metal material extends on outer sidewalls of the stacked layers of two-dimensional metallic material, and the outer sidewalls are opposite to the inner sidewalls; and
- forming a gate structure on the strip of the two-dimensional semiconductor material, wherein the gate structure contacts the inner sidewalls of the stacked layers of two-dimensional metallic material,
- wherein the sheet of the two-dimensional semiconductor material includes a thickness-modulated switchable material, and growing the stacked layers of two-dimensional metallic material comprises disposing additional thickness-modulated switchable material on the sheet of the two-dimensional semiconductor material in the trenches.

18. The manufacturing method of claim 17, wherein forming the strip of the two-dimensional semiconductor material comprises patterning the sheet of the two-dimensional semiconductor material to form parallel strips of the two-dimensional semiconductor material separated by trenches.

19. The manufacturing method of claim 17, wherein patterning the sheet of the two-dimensional semiconductor material comprises removing portions of the sheet of the two-dimensional semiconductor material at bottoms of the trenches, wherein the stacked layers of two-dimensional metallic material are formed in the trenches after removing the portions of the sheet of the two-dimensional semiconductor material, thus contacting side-by-side the strip of the two-dimensional semiconductor material.

20. The manufacturing method of claim 17, wherein the thickness-modulated switchable material includes at least one selected from $PtSe_2$, $PdSe_2$, and $PtTe_2$.

* * * * *